(12) United States Patent
Nakano et al.

(10) Patent No.: US 8,040,489 B2
(45) Date of Patent: Oct. 18, 2011

(54) SUBSTRATE PROCESSING METHOD, EXPOSURE APPARATUS, AND METHOD FOR PRODUCING DEVICE BY IMMERSING SUBSTRATE IN SECOND LIQUID BEFORE IMMERSION EXPOSURE THROUGH FIRST LIQUID

(75) Inventors: Katsushi Nakano, Kumagaya (JP); Masahiko Okumura, Tokyo (JP); Tarou Sugihara, Tokyo (JP); Takeyuki Mizutani, Kumagaya (JP); Tomoharu Fujiwara, Ageo (JP)

(73) Assignee: Nikon Corporation, Tokyo (JP)

( * ) Notice: Subject to any disclaimer, the term of this patent is extended or adjusted under 35 U.S.C. 154(b) by 58 days.

(21) Appl. No.: 11/666,165

(22) PCT Filed: Oct. 25, 2005

(86) PCT No.: PCT/JP2005/019604

§ 371 (c)(1),
(2), (4) Date: Apr. 25, 2007

(87) PCT Pub. No.: WO2006/046562

PCT Pub. Date: May 4, 2006

(65) Prior Publication Data

US 2008/0143980 A1    Jun. 19, 2008

(30) Foreign Application Priority Data

Oct. 26, 2004    (JP) .................................. 2004-310993

(51) Int. Cl.
*G03B 27/52*    (2006.01)

(52) U.S. Cl. ......................................................... 355/30

(58) Field of Classification Search .................... 355/30, 355/53
See application file for complete search history.

(56) References Cited

U.S. PATENT DOCUMENTS

| 4,346,164 A | 8/1982 | Tabarelli et al. |
| 4,480,910 A | 11/1984 | Takanashi et al. |
| 5,528,118 A | 6/1996 | Lee |
| 5,610,683 A | 3/1997 | Takahashi |
| 5,715,039 A | 2/1998 | Fukuda et al. |
| 5,825,043 A | 10/1998 | Suwa |
| 5,874,820 A | 2/1999 | Lee |

(Continued)

FOREIGN PATENT DOCUMENTS

DE    221 563 A1    4/1985

(Continued)

OTHER PUBLICATIONS

Ralph R. Dammel et al., "The PAG Leaching Phenomenon in 193nm Immersion Lithography," presented at 2004 Immersion & 157 nm Symposium, Aug. 3, 2004.

(Continued)

*Primary Examiner* — Peter B Kim
*Assistant Examiner* — Chia-how Michael Liu
(74) *Attorney, Agent, or Firm* — Oliff & Berridge, PLC

(57) ABSTRACT

A substrate processing method which includes an exposure step wherein an immersion area of a first liquid is formed on a substrate and the substrate is exposed by being irradiated with an exposure light through the first liquid, and an immersion step wherein the substrate is immersed in a second liquid before the exposure step. By this method, occurrences of problems caused by adhesion marks, which are always involved in immersion exposure, can be reduced.

28 Claims, 12 Drawing Sheets

U.S. PATENT DOCUMENTS

| | | | |
|---|---|---|---|
| 5,969,441 | A | 10/1999 | Loopstra et al. |
| 6,051,101 | A | 4/2000 | Ohtani et al. |
| RE37,391 | E | 9/2001 | Nishi |
| 6,341,007 | B1 | 1/2002 | Nishi et al. |
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 7,665,916 | B2 | 2/2010 | Yamamoto et al. |
| 7,713,685 | B2 | 5/2010 | Endo et al. |
| 7,892,722 | B2 | 2/2011 | Inabe et al. |
| 2001/0037858 | A1 | 11/2001 | Taniyama et al. |
| 2002/0054231 | A1 | 5/2002 | Masuyuki |
| 2003/0068579 | A1 | 4/2003 | Takahashi et al. |
| 2004/0165159 | A1 | 8/2004 | Lof et al. |
| 2004/0165167 | A1* | 8/2004 | Imai ................................. 355/53 |
| 2005/0058944 | A1 | 3/2005 | Takahashi et al. |
| 2005/0068499 | A1 | 3/2005 | Dodoc et al. |
| 2005/0069819 | A1* | 3/2005 | Shiobara ...................... 430/327 |
| 2005/0205108 | A1* | 9/2005 | Chang et al. ...................... 134/1 |
| 2005/0221234 | A1 | 10/2005 | Ito |
| 2005/0225735 | A1 | 10/2005 | Magome et al. |
| 2005/0243291 | A1 | 11/2005 | Kim |
| 2005/0255414 | A1 | 11/2005 | Inabe et al. |
| 2005/0259232 | A1 | 11/2005 | Streefkerk et al. |
| 2005/0277069 | A1 | 12/2005 | Endo et al. |
| 2006/0028626 | A1 | 2/2006 | Chang et al. |
| 2006/0028628 | A1 | 2/2006 | Lin et al. |
| 2006/0051709 | A1 | 3/2006 | Endo et al. |
| 2006/0110689 | A1 | 5/2006 | Chang |
| 2006/0119813 | A1 | 6/2006 | Hultermans et al. |
| 2006/0121209 | A1 | 6/2006 | Matheus Baselmans et al. |
| 2006/0132731 | A1 | 6/2006 | Jansen et al. |
| 2006/0250588 | A1 | 11/2006 | Brandl |
| 2007/0002296 | A1 | 1/2007 | Chang et al. |
| 2007/0031760 | A1 | 2/2007 | Chang et al. |
| 2007/0091287 | A1 | 4/2007 | Chang et al. |
| 2007/0093067 | A1 | 4/2007 | Chang et al. |
| 2007/0127001 | A1 | 6/2007 | Van Der Hoeven |
| 2007/0177869 | A1 | 8/2007 | Yamamoto et al. |

FOREIGN PATENT DOCUMENTS

| | | |
|---|---|---|
| DE | 224 448 A1 | 7/1985 |
| EP | 1 338 923 A1 | 8/2003 |
| EP | 1 420 298 A2 | 5/2004 |
| EP | 1 571 694 A1 | 9/2005 |
| EP | 1 598 704 A2 | 11/2005 |
| EP | 1 605 310 A2 | 12/2005 |
| EP | 1 628 329 A1 | 2/2006 |
| EP | 1 672 681 A1 | 6/2006 |
| EP | 1 672 682 A1 | 6/2006 |
| EP | 1 732 108 A1 | 12/2006 |
| EP | 1 783 822 A1 | 5/2007 |
| JP | A 58-202448 | 11/1983 |
| JP | A 59-19912 | 2/1984 |
| JP | A 62-65326 | 3/1987 |
| JP | 63-073628 * | 4/1988 |
| JP | A 63-157419 | 6/1988 |
| JP | A-4-277612 | 10/1992 |
| JP | A 4-305915 | 10/1992 |
| JP | A 4-305917 | 10/1992 |
| JP | A 5-62877 | 3/1993 |
| JP | A-6-53120 | 2/1994 |
| JP | A 6-124873 | 5/1994 |
| JP | A-6-188169 | 7/1994 |
| JP | A 7-220990 | 8/1995 |
| JP | A-8-166475 | 6/1996 |
| JP | A 8-316125 | 11/1996 |
| JP | A-8-330224 | 12/1996 |
| JP | A-10-163099 | 6/1998 |
| JP | A-10-214783 | 8/1998 |
| JP | A 10-303114 | 11/1998 |
| JP | A 10-340846 | 12/1998 |
| JP | A-11-135400 | 5/1999 |
| JP | A 11-176727 | 7/1999 |
| JP | A 2000-58436 | 2/2000 |
| JP | A-2000-505958 | 5/2000 |
| JP | A 2000-241990 | 9/2000 |
| JP | A 2001-319849 | 11/2001 |
| JP | A-2001-345245 | 12/2001 |
| JP | A 2002-343698 | 11/2002 |
| JP | A 2005-101487 | 4/2005 |
| JP | A 2005-277053 | 10/2005 |
| JP | A 2005-294520 | 10/2005 |
| JP | A 2005-353763 | 12/2005 |
| JP | A 2006-5335 | 1/2006 |
| WO | WO 99/49504 | 9/1999 |
| WO | WO 2004/019128 A2 | 3/2004 |
| WO | WO 2004/053952 A1 | 6/2004 |
| WO | WO 2004/055803 A1 | 7/2004 |
| WO | WO 2004/057589 | 7/2004 |
| WO | WO 2004/057590 | 7/2004 |
| WO | WO 2004/093130 A2 | 10/2004 |
| WO | WO 2004/105107 A1 | 12/2004 |
| WO | WO 2005/029559 | 3/2005 |
| WO | WO 2005/036621 A1 | 4/2005 |
| WO | WO 2005/036623 A1 | 4/2005 |
| WO | WO 2005/124833 A1 | 12/2005 |

OTHER PUBLICATIONS

European Search Report dated Dec. 4, 2009 for European Patent No. 05805228.3.
Office Action dated Sep. 10, 2009 for U.S. Appl. No. 11/808,349, filed Jun. 8, 2007.
Office Action dated Sep. 1, 2009 for U.S. Appl. No. 12/155,714, filed Jun. 9, 2008.
Office Action dated Dec. 8, 2008 for U.S. Appl. No. 12/155,714, filed Jun. 9, 2008.
Office Action issued in U.S. Appl. No. 12/155,714; mailed Apr. 23, 2010.
Oct. 21, 2010 European Office Action issued in European Application No. 05 805 228.3.
Jun. 24, 2010 Office Action issued in U.S Appl. No. 11/808,349.
Dec. 9, 2010 Office Action issued in U.S. Appl. No. 12/155,714.
Jan. 24, 2011 Office Action issued in U.S. Appl. No. 11/808,349.
Jan. 31, 2006 International Search Report issued in International Application No. PCT/JP2005/019604 (with translation).
Jan. 10, 2011 Office Action issued in Chinese Patent Application No. 201010140711.0 (with translation).
Nov. 7, 2008 Office Action issued in Chinese Patent Application No. 200580035989.9 (with translation).
Feb. 2, 2010 Office Action issued in Japanese Patent Application No. 2005-309546 (with translation).
Jan. 31, 2006 Written Opinion of the International Searching Authority issued in International Patent Application No. PCT/JP2005/019604 (with translation).
Jul. 1, 2011 Office Action issued in U.S. Appl. No. 11/808,349.

* cited by examiner

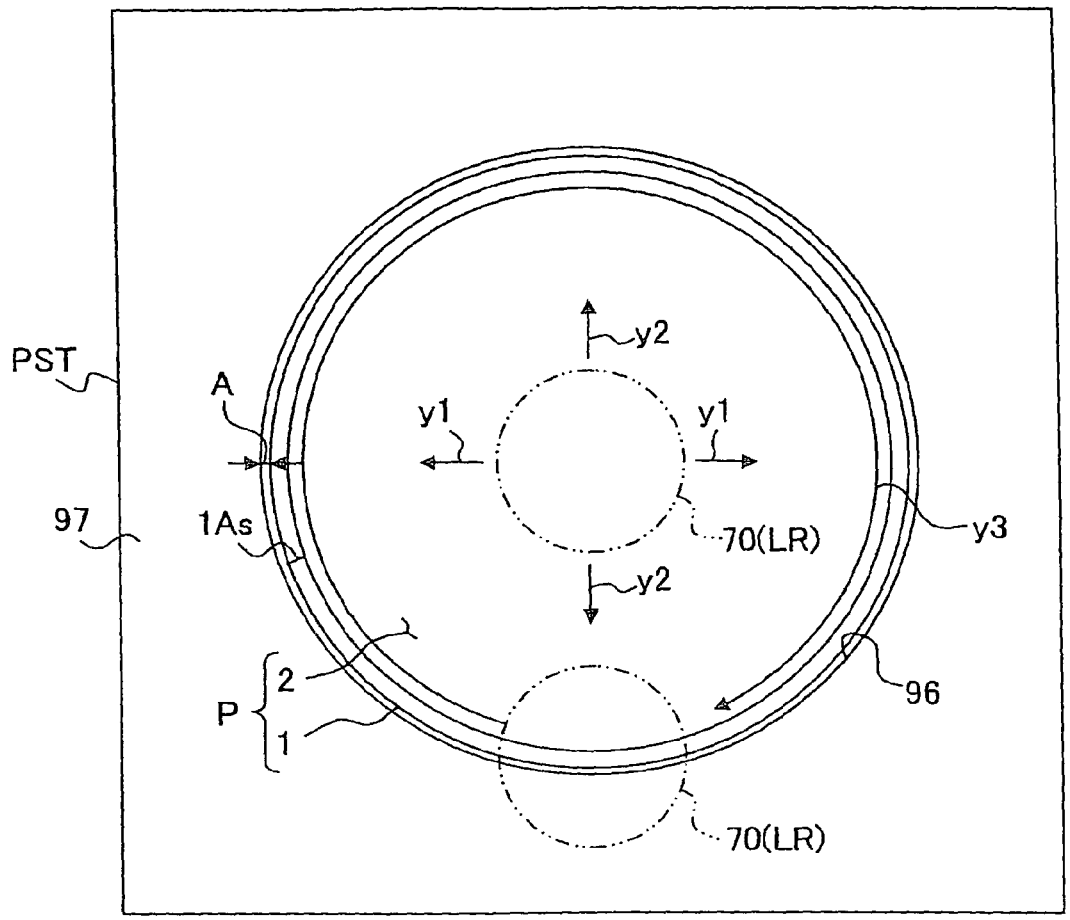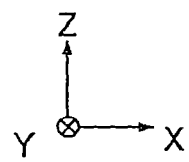

SUBSTRATE PROCESSING METHOD, EXPOSURE APPARATUS, AND METHOD FOR PRODUCING DEVICE BY IMMERSING SUBSTRATE IN SECOND LIQUID BEFORE IMMERSION EXPOSURE THROUGH FIRST LIQUID

TECHNICAL FIELD

The present invention relates to a substrate processing method including a step for exposing a substrate, an exposure apparatus, and a method for producing a device.

BACKGROUND ART

An exposure apparatus, which performs the projection exposure onto a photosensitive substrate with a pattern formed on a mask, is used in the photolithography step as one of the steps of producing microdevices such as semiconductor devices and liquid crystal display devices. The exposure apparatus includes a mask stage for supporting the mask and a substrate stage for supporting the substrate. The pattern of the mask is subjected to the projection exposure onto the substrate via a projection optical system while successively moving the mask stage and the substrate stage. In the microdevice production, it is required to realize a fine and minute pattern to be formed on the substrate in order to achieve a high density of the device. In order to respond to this requirement, it is demanded to realize a higher resolution of the exposure apparatus. A liquid immersion exposure apparatus, in which a liquid immersion area is formed by filling the space between the projection optical system and the substrate with a liquid to perform the exposure process via the liquid of the liquid immersion area, has been contrived as one of means to realize the high resolution, as disclosed in International Publication No. 99/49504.

DISCLOSURE OF THE INVENTION

Task to be Solved by the Invention

When the liquid remains on the substrate, and the liquid is vaporized, then there is such a possibility that any adhesion trace (so-called water mark) may be formed on the substrate. The adhesion trace acts as a foreign matter. Therefore, if various processes including, for example, the development process are executed for the substrate in a state in which the adhesion trace is formed on the substrate, an inconvenience such as the pattern defect arises. If the substrate is unloaded in a state in which the adhesion trace is formed on the substrate, the following inconvenience arises. That is, a transport (contaminated) therewith, and a carrier for accommodating the substrate is polluted therewith.

The present invention has been made taking the foregoing circumstances into consideration, an object of which is to provide a substrate processing method, an exposure apparatus, and a method for producing a device based on the use of the exposure apparatus, wherein it is possible to suppress the occurrence of any inconvenience which would be otherwise caused by the foreign matter (for example, the adhesion trace of the liquid) adhered onto a substrate.

Solution for the Task

In order to achieve the object as described above, the present invention adopts the following constructions.

According to a first aspect of the present invention, there is provided a substrate processing method including an exposure step for exposing a substrate by forming a liquid immersion area of a first liquid on the substrate and radiating an exposure light beam onto the substrate through the first liquid; and an immersing step for immersing the substrate in a second liquid before the exposure step.

According to the first aspect of the present invention, the substrate is immersed in the second liquid before radiating the exposure light beam onto the substrate through the first liquid (in the step before the exposure step). Accordingly, it is possible to suppress the occurrence of the inconvenience which would be otherwise caused by an adhesion trace formed on the substrate. The immersion of the substrate in the second liquid in the immersing step is the operation which is different from the operation of contact of the substrate with the first liquid in order to perform the liquid immersion exposure in the exposure step.

According to a second aspect of the present invention, there is provided a substrate processing method including an exposure step for exposing a substrate by radiating an exposure light beam onto the substrate through a first liquid; and a cleaning step for cleaning the substrate with a second liquid after the substrate has made contact with the first liquid in order to miniaturize or remove a foreign matter adhered onto the substrate due to an eluted matter eluted from the substrate into the first liquid.

According to the second aspect of the present invention, the substrate after making the contact with the first liquid is cleaned with the second liquid. Accordingly, the foreign matter (for example, the adhesion trace of the liquid), which is adhered onto the substrate due to the eluted matter eluted from the substrate into the first liquid, can be decreased or miniaturized to have minute sizes, or removed. Therefore, it is possible to suppress the occurrence of the inconvenience which would be otherwise caused by the foreign matter as described above.

According to a third aspect of the present invention, there is provided a substrate processing method including holding a substrate by a holder; an exposure step for exposing the substrate by radiating an exposure light beam onto the substrate through a first liquid; and a cleaning step for cleaning the exposed substrate with a second liquid while holding the exposed substrate by the holder. According to the third aspect of the present invention, the foreign matter, which is adhered onto the substrate, can be decreased or miniaturized or removed by cleaning, with the second liquid, the substrate after the substrate has made contact with the first liquid while retaining the substrate by the substrate holder. Therefore, it is possible to suppress the occurrence of the inconvenience which would be otherwise caused by the foreign matter as described above.

According to a fourth aspect of the present invention, there is provided a method for producing a device; including the substrate processing method as defined in the first aspect; a step for developing the substrate after the exposure step; and a step for processing the developed substrate.

According to a fifth aspect of the present invention, there is provided a method for producing a device; including the substrate processing method as defined in the second or third aspect; a step for developing the substrate; and a step for processing the developed substrate.

According to the methods for producing the device concerning the fourth and fifth aspects of the present invention, the substrate can be processed while suppressing the occurrence of the inconvenience which would be otherwise caused by the foreign matter (for example, the adhesion trace of the liquid). Therefore, it is possible to produce the device having the desired performance.

According to a sixth aspect of the present invention, there is provided an exposure apparatus which exposes a substrate by forming a liquid immersion area of a first liquid on the substrate and radiating an exposure light beam onto the substrate through the first liquid; the exposure apparatus including a substrate holder which holds the substrate; and an immersion device which immerses the substrate in a second liquid before exposing the substrate through the first liquid.

According to the sixth aspect of the present invention, the immersion device immerses the substrate in the second liquid before exposing the substrate by radiating the exposure light beam onto the substrate through the first liquid. Accordingly, it is possible to suppress the occurrence of the inconvenience which would be otherwise caused by the foreign matter (for example, the adhesion trace of the liquid) adhered onto the substrate.

According to a seventh aspect of the present invention, there is provided an exposure apparatus which exposes a substrate by forming a liquid immersion area of a first liquid on the substrate and radiating an exposure light beam onto the substrate through the first liquid; the exposure apparatus including a cleaning device which cleans the substrate with a second liquid after the substrate has made contact with the first liquid in order to miniaturize or remove a foreign matter adhered onto the substrate due to an eluted matter eluted from the substrate into the first liquid.

According to the seventh aspect of the present invention, the cleaning device cleans, with the second liquid, the substrate after the substrate has made contact with the first liquid. Accordingly, it is possible to decrease or miniaturize or remove the foreign matter (for example, the adhesion trace of the liquid) adhered onto the substrate due to the eluted matter eluted from the substrate into the first liquid. Therefore, it is possible to suppress the occurrence of the inconvenience which would be otherwise caused by the foreign matter.

According to an eighth aspect of the present invention, there is provided a method for producing a device, including using the exposure apparatus as defined in any one of the aspects described above.

According to the eighth aspect of the present invention, the substrate can be processed while suppressing the occurrence of the inconvenience which would be otherwise caused by the foreign matter (for example, the adhesion trace of the liquid) adhered to the substrate. Therefore, it is possible to produce the device having the desired performance.

EFFECT OF THE INVENTION

According to the present invention, the predetermined process can be satisfactorily applied to the substrate, and it is possible to produce the device having the desired performance.

BRIEF DESCRIPTION OF THE DRAWINGS

FIG. 14 shows a plan view illustrating an example of the operation for cleaning the substrate.

BEST MODE FOR CARRYING OUT THE INVENTION

Embodiments of the present invention will be explained below with reference to the drawings. However, the present invention is not limited thereto.

First Embodiment

Figure 1:
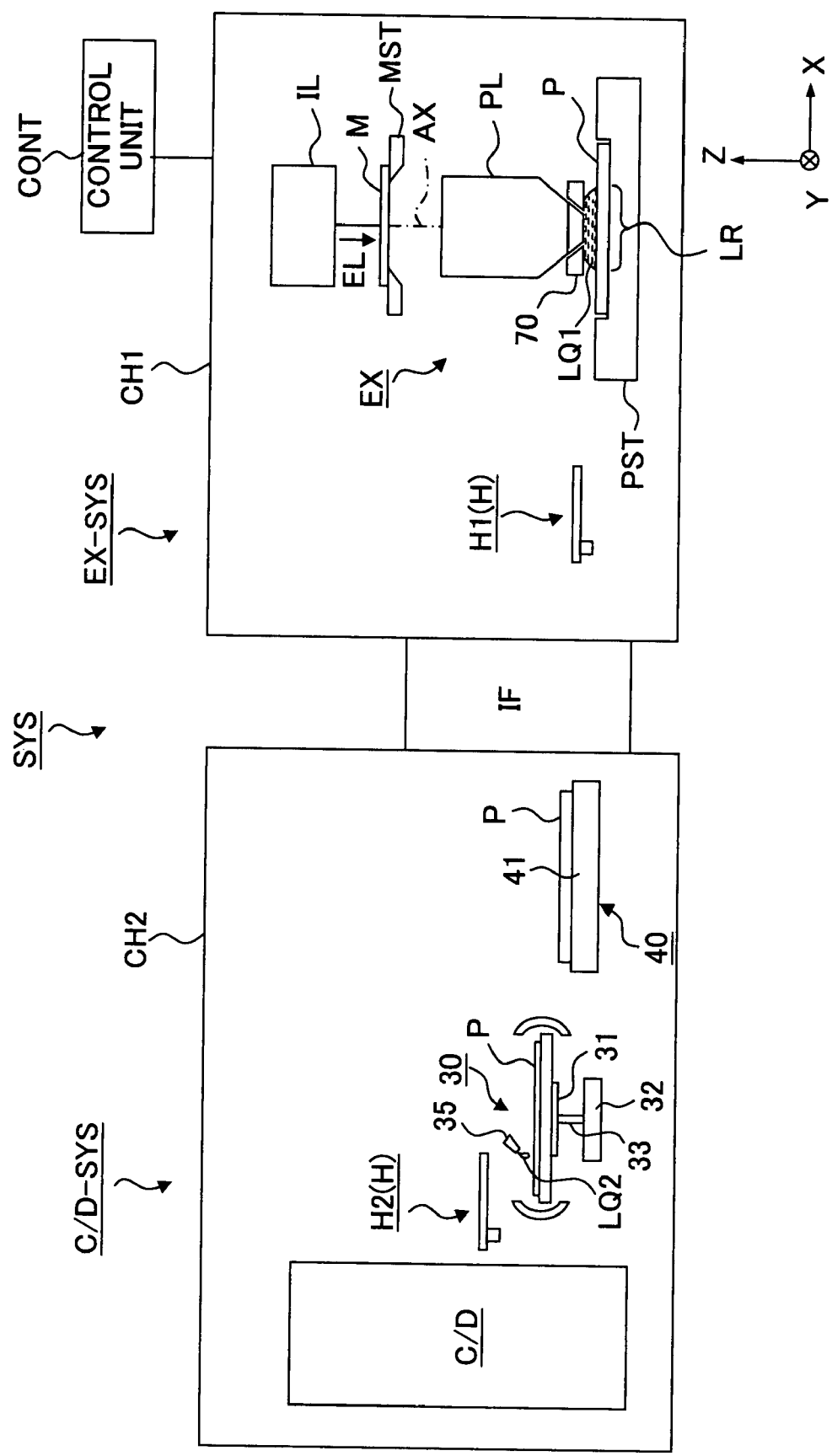
FIG. 1 shows a device production system including an exposure apparatus according to a first embodiment.

FIG. 1 shows an embodiment of a device production system provided with an exposure apparatus according to a first embodiment. With reference to FIG. 1, the device production system SYS includes an exposure apparatus EX-SYS, a coater/developer apparatus C/D-SYS, and a transport system H which transports a substrate P. The exposure apparatus EX-SYS includes an interface IF which forms the connecting portion with respect to the coater/developer apparatus C/D-SYS, a main exposure apparatus body EX which forms a liquid immersion area LR of a first liquid LQ1 on the substrate P and which exposes the substrate P by radiating the exposure light beam EL onto the substrate P through the first liquid LQ1, and a control unit CONT which integrally controls the operation of the entire exposure apparatus EX-SYS. The coater/developer apparatus C/D-SYS is provided with a main coater/developer body C/D including a coating unit (not shown) which coats the base material of the substrate P before being subjected to the exposure process with a photosensitive material (resist), and a developing unit (not shown) which performs the development process for the substrate P after being subjected to the exposure process in the main exposure apparatus body EX. The main exposure apparatus body EX is arranged in a first chamber apparatus CH1 in which the cleanness is managed. On the other hand, the main coater/developer body C/D, which includes the coating unit and the developing unit, is arranged in a second chamber apparatus CH2 which is distinct from the first chamber apparatus CH1. The first chamber apparatus CH1 for accommodating the main exposure apparatus body EX is connected to the second chamber apparatus CH2 for accommodating the main coater/developer body C/D via the interface IF.

The transport system H includes a first transport system H1 which transports the substrate P between the interface IF and the main exposure apparatus body EX, and a second transport system H2 which transports the substrate P between the interface IF and main coater/developer body C/D. The first transport system H1 constitutes a part of the exposure apparatus EX-SYS, and the second transport system H2 constitutes a part of the coater/developer apparatus C/D-SYS. The first transport system H1 is provided in the first chamber apparatus CH1, and the second transport system H2 is provided in the second chamber apparatus CH2.

An immersion unit 30 for immersing the substrate P in a second liquid LQ2 and a temperature regulation mechanism 40 for regulating the temperature of the substrate P are provided at intermediate positions of the transport passage of the transport system H. In this embodiment, the immersion unit 30 and the temperature regulation mechanism 40 are provided for the coater/developer apparatus C/D-SYS. The immersion unit 30 and the temperature regulation mechanism 40 are provided at intermediate positions of the transport passage of the second transport system H2 in the second chamber apparatus CH2.

The first transport system H1 has the following function. That is, the substrate P before being subjected to the exposure process is loaded on the substrate stage PST of the main exposure apparatus body EX. Further, the substrate P after being subjected to the exposure process is unloaded out of the substrate stage PST of the main exposure apparatus body EX. The substrate P, which is subjected to the coating process with the photosensitive material by the coating unit of the main coater/developer body C/D, is subjected to the predetermined processes by the immersion unit 30 and the temperature regulation mechanism 40. After that, the substrate P is delivered to the first transport system H1 via the interface IF by the second transport system H2. In this arrangement, openings and shutters for opening/closing the openings are provided at portions of the first and second chamber apparatuses CH1, CH2 allowed to face the interface IF respectively. The shutter is opened during the transport operation of the substrate P with respect to the interface IF. The substrate P before being subjected to the exposure process is loaded by the first transport system H1 on the substrate stage PST of the main exposure apparatus body EX. The substrate P after being subjected to the exposure process is unloaded out of the substrate stage PST by the first transport system H1. The first transport system H1 delivers the unloaded substrate P to the second transport system H2 of the coater/developer apparatus C/D-SYS via the interface IF. The second transport system H2 transports the substrate P after being subjected to the exposure process to the developing unit of the main coater/developer body C/D. The development process is performed to the delivered substrate P by the developing unit of the main coater/developer body C/D.

Figure 2:
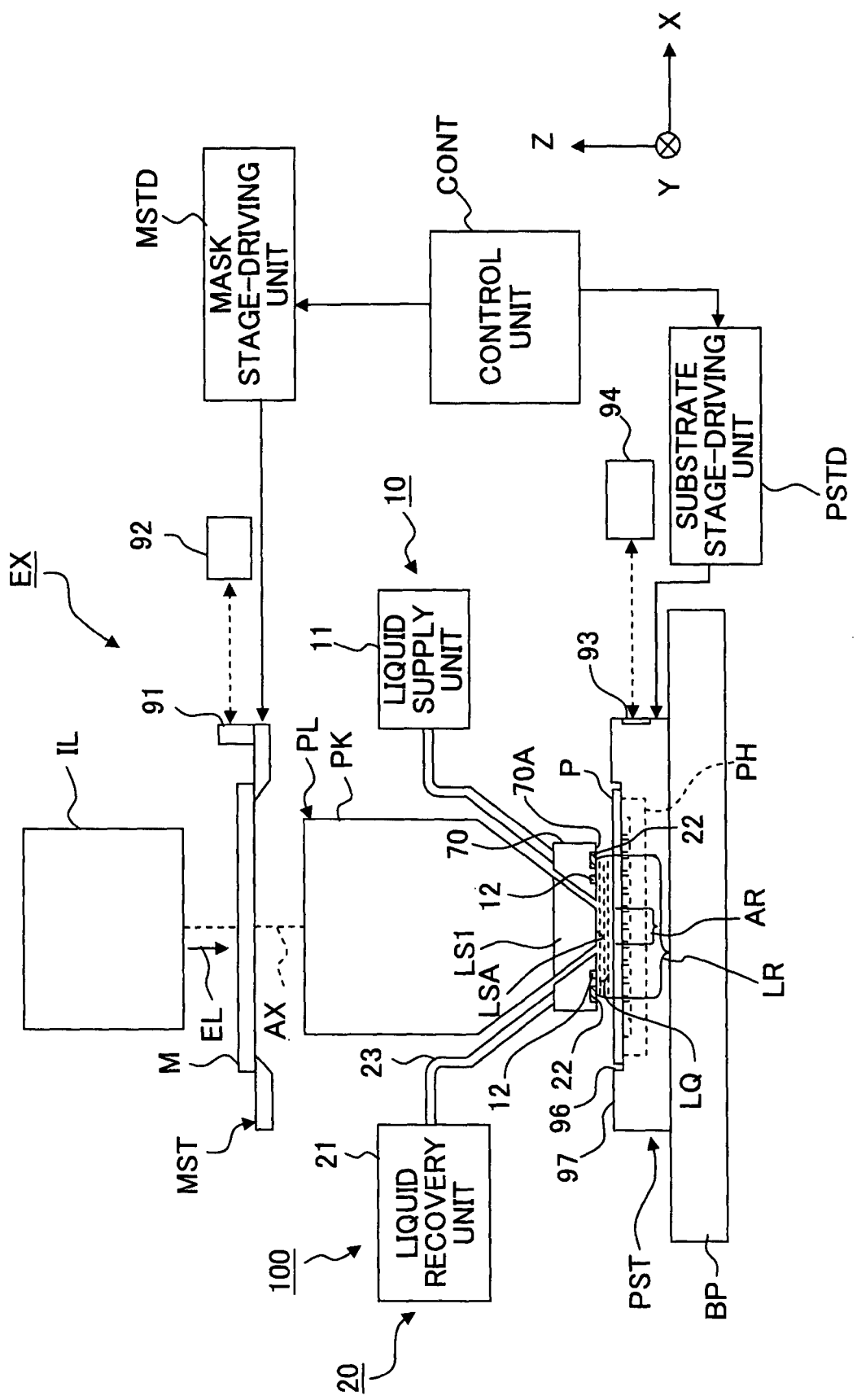
FIG. 2 shows a schematic arrangement illustrating a main exposure apparatus body.

Next, an explanation will be made about the main exposure apparatus body EX with reference to FIG. 2. FIG. 2 shows a schematic arrangement illustrating the main exposure apparatus body EX. With reference to FIG. 2, the main exposure apparatus body EX includes a mask stage MST which is movable while retaining a mask M, a substrate stage PST which has the substrate holder PH for holding the substrate P and which is capable of moving the substrate holder PH that holds the substrate P, an illumination optical system IL which illuminates, with an exposure light beam EL, the mask M retained by the mask stage MST, and a projection optical system PL which projects an image of a pattern of the mask M illuminated with the exposure light beam EL onto the substrate P.

The main exposure apparatus body EX of this embodiment is a liquid immersion exposure apparatus to which the liquid immersion method is applied in order that the exposure wavelength is substantially shortened to improve the resolution and the depth of focus is substantially widened. The main exposure apparatus body EX is provided with a liquid immersion mechanism 100 which fills, with the first liquid LQ1, the optical path space for the exposure light beam EL disposed on the image plane side of the projection optical system PL. The liquid immersion mechanism 100 includes a nozzle member 70 which is provided in the vicinity of the image plane of the projection optical system PL and which has a supply port 12 for supplying the first liquid LQ1 and a recovery port 22 for recovering the first liquid LQ1, a liquid supply mechanism 10 which supplies the first liquid LQ1 to the image plane side of the projection optical system PL via the supply port 12 provided for the nozzle member 70, and a liquid recovery mechanism 20 which recovers the first liquid LQ1 disposed on the image plane side of the projection optical system PL via the recovery port 22 provided for the nozzle member 70. The nozzle member 70 is formed in an annular form so that a first optical element LS1, which is included in a plurality of optical elements for constructing the projection optical system PL and which is disposed closest to the image plane of the projection optical system PL, is surrounded over the substrate P (substrate stage PST).

The main exposure apparatus body EX forms the liquid immersion area LR of the first liquid LQ1 locally on a part of the substrate P including a projection area AR of the projection optical system PL by the first liquid LQ1 supplied from the liquid supply mechanism 10 at least during the period in which the pattern image of the mask M is projected onto the substrate P, the liquid immersion area LR being larger than the projection area AR and smaller than the substrate P. Specifically, the main exposure apparatus body EX fills, with the first liquid LQ1, the optical path space which is disposed between the lower surface LSA of the first optical element LS1 arranged closest to the image plane of the projection optical system PL and the upper surface of the substrate P arranged on the image plane side of the projection optical system PL. The exposure light beam EL, which is allowed to pass through the mask M, is radiated onto the substrate P via the projection optical system PL and the first liquid LQ1 disposed between the projection optical system PL and the substrate P. Accordingly, the projection exposure of the pattern of the mask M is performed on the substrate P. The control unit CONT locally forms the liquid immersion area LR of the first liquid LQ1 on the substrate P such that a predetermined amount of the first liquid LQ1 is supplied onto the substrate P by using the liquid supply mechanism 10, and a predetermined amount of the first liquid LQ1 disposed on the substrate P is recovered by using the liquid recovery mechanism 20.

The embodiment of the present invention will be explained as exemplified by a case of the use of the scanning type exposure apparatus (so-called scanning stepper) as the main exposure apparatus body EX in which the substrate P is exposed with the pattern formed on the mask M while synchronously moving the mask M and the substrate P in mutually different directions (opposite directions) in the scanning directions. In the following explanation, the X axis direction resides in the synchronous movement direction (scanning direction) for the mask M and the substrate P in the horizontal plane, the Y axis direction (non-scanning direction) resides in the direction which is perpendicular to the X axis direction in the horizontal plane, and the Z axis direction resides in the direction which is perpendicular to the X axis direction and the Y axis direction and which is coincident with the optical axis AX of the projection optical system PL. The directions of rotation (inclination) about the X axis, the Y axis, and the Z axis are designated as θX, θY, and θZ directions respectively. The term "substrate" referred to herein includes those obtained by coating a base material such as a semiconductor wafer with a photosensitive material (resist), and the term "mask" includes a reticle formed with a device pattern to be subjected to the reduction projection onto the substrate.

The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a field diaphragm which sets the illumination area on the mask M illuminated with the exposure light beam EL. The predetermined illumination area on the mask M is illuminated with the exposure light beam EL having a uniform illuminance distribution by means of the illumination optical system IL. Those usable as the exposure light beam EL radiated from the illumination optical system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

In this embodiment, pure water is used as the first liquid LQ1 for forming the liquid immersion area LR. Not only the ArF excimer laser but also the emission lines (g-ray, h-ray, i-ray) radiated, for example, from a mercury lamp and the far ultraviolet light beams (DUV light beams) such as the KrF excimer laser beam (wavelength: 248 nm) are transmissive through pure water.

The mask stage MST is movable while retaining the mask M. The mask stage MST retains the mask M by means of the vacuum attraction (or the electrostatic attraction). The mask stage MST is two-dimensionally movable in the plane perpendicular to the optical axis AX of the projection optical system PL, i.e., in the XY plane, and it is finely rotatable in the θZ direction in a state in which the mask M is retained, in accordance with the driving of a mask stage-driving unit MSTD including a linear motor controlled by the control unit CONT. A movement mirror 91, which is movable together with the mask stage MST, is provided on the mask stage MST. A laser interferometer 92 is provided at a position opposed to the movement mirror 91. The position in the two-dimensional direction and the angle of rotation in the θZ direction (including the angles of rotation in the θX and θY directions in some situations as well) of the mask M on the mask stage MST are measured in real-time by the laser interferometer 92. The result of the measurement of the laser interferometer 92 is outputted to the control unit CONT. The control unit CONT drives the mask stage-driving unit MSTD on the basis of the result of the measurement obtained by the laser interferometer 92 to thereby control the position of the mask M retained by the mask stage MST.

The projection optical system PL projects the image of the pattern of the mask M onto the substrate P at a predetermined projection magnification β. The projection optical system PL includes a plurality of optical elements. The optical elements are retained by a barrel PK. In this embodiment, the projection optical system PL is based on the reduction system having the projection magnification β which is, for example, ¼, ⅕, or ⅛. The projection optical system PL may be based on any one of the 1× magnification system and the magnifying system. The projection optical system PL may be based on any one of the dioptric system, the catoptric system, and the cata-dioptric system. In this embodiment, the first optical element LS1, which is included in the plurality of optical elements for constructing the projection optical system PL and which is disposed closest to the image plane of the projection optical system PL, is exposed from the barrel PK.

The substrate stage PST has a substrate holder PH which holds the substrate P. The substrate holder PH is movable on the base member BP on the image plane side of the projection optical system PL. The substrate holder PH holds the substrate P, for example, by means of the vacuum attraction. A recess 96 is provided on the substrate stage PST. The substrate holder PH for holding the substrate P is arranged in the recess 96. The upper surface 97 of the substrate stage PST other than the recess 96 is a flat surface (flat section) which has approximately the same height as that of (flush with) the upper surface of the substrate P held by the substrate holder PH.

The substrate stage PST is two-dimensionally movable in the XY plane on the base member BP, and it is finely rotatable in the θZ direction in a state in which the substrate P is retained by the aid of the substrate holder PH, in accordance with the driving of the substrate stage-driving unit PSTD including a linear motor or the like controlled by the control unit CONT. Further, the substrate stage PST is also movable in the Z axis direction, the θX direction, and the θY direction. Therefore, the upper surface of the substrate P supported by the substrate stage PST is movable in the directions of six degrees of freedom in the X axis, Y axis, Z axis, θX, θY, and θZ directions. A movement mirror 93, which is movable together with the substrate stage PST, is secured to the side surface of the substrate stage PST. A laser interferometer 94 is provided at a position opposed to the movement mirror 93. The position in the two-dimensional direction and the angle of rotation of the substrate P on the substrate stage PST are measured in real time by the laser interferometer 94. The exposure apparatus EX is provided with a focus/leveling-detecting system (not shown) based on the oblique incidence system which detects the surface position information about the upper surface of the substrate P supported by the substrate stage PST as disclosed, for example, in Japanese Patent Application Laid-open No. 8-37149. The focus/leveling-detecting system detects the surface position information about the upper surface of the substrate P (position information in the Z axis direction, and the information about the inclination in the θX and θY directions of the substrate P). A system based on the use of an electrostatic capacity type sensor may be adopted for the focus/leveling-detecting system. The result of the measurement performed by the laser interferometer 94 is outputted to the control unit CONT. The result of the detection performed by the focus/leveling-detecting system is also outputted to the control unit CONT. The control unit CONT drives the substrate stage-driving unit PSTD on the basis of the detection result of the focus/leveling-detecting system to adjust and match the upper surface of the substrate P with respect to the image plane of the projection optical system PL by controlling the focus position (Z position) and the angle of inclination (θX, θY) of the substrate P. Further, the position control is performed in the X axis direction, the Y axis direction, and the θZ direction of the substrate P on the basis of the measurement result of the laser interferometer 94.

Next, an explanation will be made about the liquid supply mechanism 10 and the liquid recovery mechanism 20 of the liquid immersion mechanism 100. The liquid supply mechanism 10 supplies the first liquid LQ1 to the image plane side of the projection optical system PL. The liquid supply mechanism 10 is provided with a liquid supply unit 11 which is capable of feeding the first liquid LQ1, and a supply tube 13 which has one end connected to the liquid supply unit 11. The other end of the supply tube 13 is connected to the nozzle member 70. An internal flow passage (supply flow passage), which connects the supply port 12 and the other end of the supply tube 13, is formed in the nozzle member 70. The liquid supply unit 11 includes, for example, a tank for accommodating the first liquid LQ1, a pressurizing pump, and a filter unit for removing any foreign matter from the first liquid LQ1. The liquid supply operation of the liquid supply unit 11 is controlled by the control unit CONT. It is not necessarily indispensable that the main exposure apparatus body EX is provided with all of the tank, the pressurizing pump, the filter unit and the like of the liquid supply mechanism 10. These components may be replaced with the equipment of a factory or the like in which the main exposure apparatus body EX is installed.

The liquid recovery mechanism 20 recovers the first liquid LQ1 disposed on the image plane side of the projection optical system PL. The liquid recovery mechanism 20 includes a liquid recovery unit 21 which is capable of recovering the first liquid LQ1, and a recovery tube 23 which has one end connected to the liquid recovery unit 21. The other end of the recovery tube 23 is connected to the nozzle member 70. An internal flow passage (recovery flow passage), which connects the recovery port 22 and the other end of the recovery tube 23, is formed in the nozzle member 70. The liquid recovery unit 21 is provided with, for example, a vacuum system (suction unit) such as a vacuum pump or the like, a gas/liquid separator for separating the recovered first liquid LQ1 from the gas, and a tank for accommodating the recovered first liquid LQ1. It is not necessarily indispensable that the main exposure apparatus body EX is provided with all of the vacuum system, the gas/liquid separator, the tank and the like of the liquid recovery mechanism 20. These components may be replaced with the equipment of a factory or the like in which the main exposure apparatus body EX is installed.

The supply port 12 for supplying the first liquid LQ1 and the recovery port 22 for recovering the first liquid LQ1 are formed on the lower surface 70A of the nozzle member 70. The lower surface 70A of the nozzle member 70 is provided at the position opposed to the upper surface of the substrate P and the upper surface 97 of the substrate stage PST. The nozzle member 70 is the annular member which is provided to surround the side surface of the first optical element LS1. A plurality of the supply ports 12 are provided on the lower surface 70A of the nozzle member 70 to surround the first optical element LS1 of the projection optical system PL (optical axis AX of the projection optical system PL). The recovery port 22 is provided outside while being separated from the supply ports 12 with respect to the first optical element LS1 on the lower surface 70A of the nozzle member 70. The recovery port 22 is provided to surround the first optical element LS1 and the supply ports 12.

The control unit CONT locally forms the liquid immersion area LR of the first liquid LQ1 on the substrate P by supplying a predetermined amount of the first liquid LQ1 onto the substrate P by using the liquid supply mechanism 10 and recovering a predetermined amount of the first liquid LQ1 disposed on the substrate P by using the liquid recovery mechanism 20. When the liquid immersion area LR of the first liquid LQ1 is formed, the control unit CONT drives the liquid supply unit 11 and the liquid recovery unit 21 respectively. When the first liquid LQ1 is fed from the liquid supply unit 11 under the control of the control unit CONT, the first liquid LQ1, which is fed from the liquid supply unit 11, is allowed to flow through the supply tube 13. After that, the first liquid LQ1 is supplied to the image plane side of the projection optical system PL from the supply ports 12 via the supply flow passage of the nozzle member 70. When the liquid recovery unit 21 is driven under the control of the control unit CONT, the first liquid LQ1, which is disposed on the image plane side of the projection optical system PL, is allowed to flow into the recovery flow passage of the nozzle member 70 via the recovery port 22. The first liquid LQ1 is allowed to flow through the recovery tube 23, and then the first liquid LQ1 is recovered by the liquid recovery unit 21.

Figure 3:
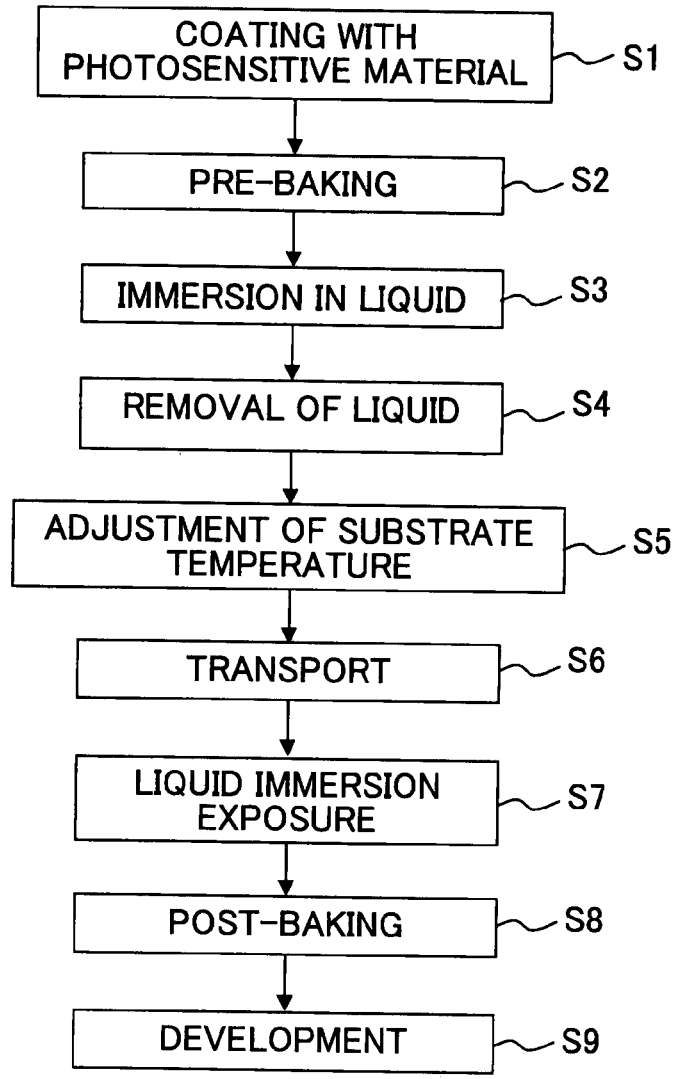
FIG. 3 shows a flow chart illustrating an example of the operation of the device production system.

Next, an explanation will be made with reference to a flow chart shown in FIG. 3 about the operation of the device production system SYS provided with the main exposure apparatus body EX as described above.

At first, the coating unit of the main coater/developer body C/D is used to perform the coating process in which the base material including the silicon wafer (semiconductor wafer) is coated with the photosensitive material (Step S1). In the coating process, the base material is coated with the photosensitive material, for example, by means of a predetermined coating method such as the spin coat method. A predetermined pretreatment is performed for the base material before coating the base material with the photosensitive material. The pretreatment includes, for example, a cleaning (washing) treatment for removing any foreign matter from the base material, a drying treatment for drying the base material after the cleaning, and a surface-modifying treatment for improving the tight contact performance between the base material and the photosensitive material. The surface-modifying treatment includes, for example, a treatment in which the base material is coated with hexamethyldisilazane (HMDS) or the like. As for the pretreatment, it is also allowable to coat the base material (lower surface of the photosensitive material) with an anti-reflective film (bottom ARC (Anti-Reflective Coating)).

Figure 4:
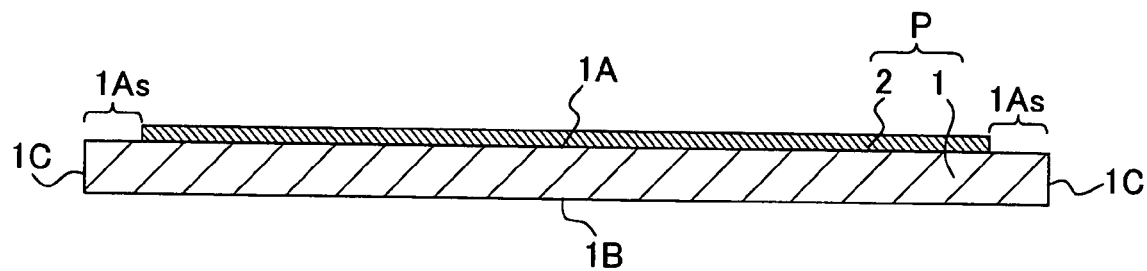
FIG. 4 shows a side sectional view illustrating an example of a substrate.

FIG. 4 shows an example of the substrate P after performing the coating process in the main coater/developer body C/D. With reference to FIG. 4, the substrate P has the base material 1, and the photosensitive material 2 with which a part of the upper surface 1A of the base material 1 is coated. As described above, the base material 1 includes, for example, the silicon wafer. An area, which occupies almost all of the central portion of the upper surface 1A of the base material 1, is coated with the photosensitive material 2 to have a predetermined thickness (for example, about 200 nm). On the other hand, the circumferential edge portion 1As of the upper surface 1A of the base material 1 is not coated with the photosensitive material 2. The base material 1 is exposed at the circumferential edge portion 1As of the upper surface 1A. The side surface 1C and the lower surface (back surface) 1B of the base material 1 are not coated with the photosensitive material 2. In this embodiment, a chemical amplification type resist is used as the photosensitive material 2.

When the photosensitive material 2 is provided on the base material 1 by means of the predetermined coating method such as the spin coat method, the circumferential edge portion of the base material 1 is also coated with the photosensitive material 2. This portion makes contact with the transport arm of the transport system for transporting the substrate P and the rack or shelf (substrate support section) of the carrier for storing the substrate P. It is feared that the photosensitive material 2, which is disposed at the circumferential edge portion of the base material 1, may be exfoliated by the mechanical contact. If the photosensitive material 2 is exfoliated, then the exfoliated matter not only serves as the foreign matter to pollute the transport arm and the carrier therewith, but there is also such a possibility that the polluted matter makes contact with the clean substrate P again to expand the pollution. Further, the following phenomenon may arise in some situations. That is, a large amount of the photosensitive material 2 is provided so that the photosensitive material 2 at the circumferential edge portion of the base material 1 rises more upwardly than that at the central portion. The photosensitive material 2, which is disposed at the circumferential edge portion of the base material 1, tends to be exfoliated with ease. The exfoliated photosensitive material 2 behaves as the foreign matter. If the foreign matter adheres onto the substrate P, the pattern transfer accuracy is affected thereby. Accordingly, a treatment (so-called "edge rinse"), in which the photosensitive material 2 disposed at the circumferential edge portion 1As is removed by using, for example, a solvent, is performed before performing the exposure process after providing the photosensitive material 2 on the base material 1 by means of the predetermined coating method. Accordingly, the photosensitive material 2 is removed at the circumferential edge portion of the base material 1 (substrate P). The base material 1 is exposed at the circumferential edge portion 1As as shown in FIG. 4.

The heat treatment (pre-baking) is performed for the substrate P (Step 2) after performing the coating process for coating the base material 1 with the photosensitive material 2. The solvent, which remains in the photosensitive material 2, is volatilized by means of the pre-baking.

Subsequently, the immersion process is performed, in which the substrate P is immersed in the second liquid LQ2 (Step S3). The immersion process is performed by the immersion unit 30 provided for the coater/developer apparatus C/D-SYS. The immersion unit 30 immerses the substrate P in the second liquid LQ2 under a preset predetermined immersion condition on the basis of the information about the substrate P.

Figure 5:
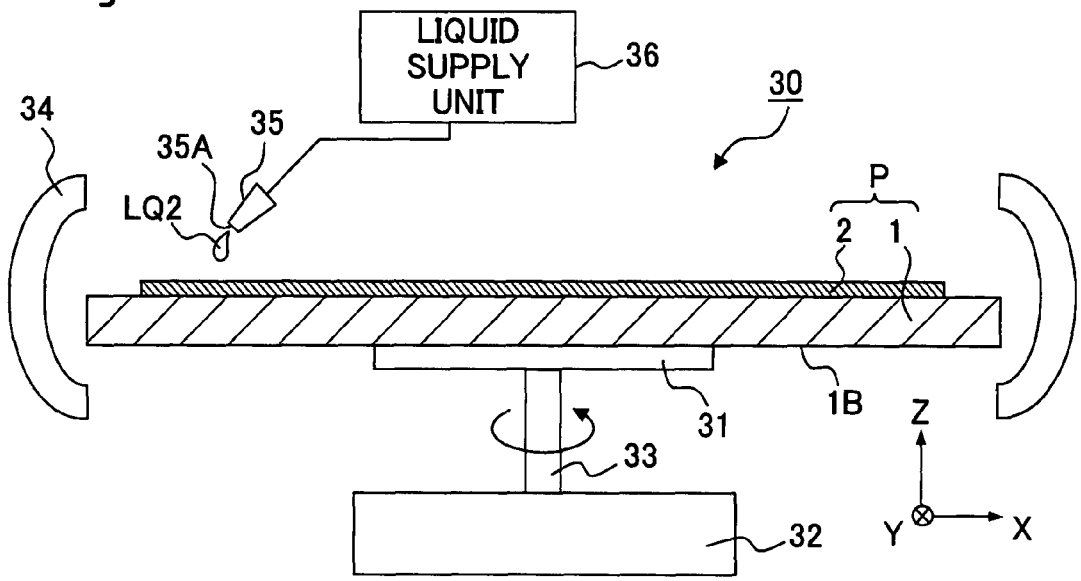
FIG. 5 shows an example of an immersion unit.

FIG. 5 shows the immersion unit 30. With reference to FIG. 5, the immersion unit 30 is provided with a holder 31 which holds a central portion of the lower surface of the substrate P (lower surface 1B of the base material 1), a shaft 33 which is connected to the holder 31, a rotating mechanism 32 which rotates the holder 31 that holds the substrate P by the aid of the shaft 33, a ring-shaped member 34 which is provided to surround the circumference of the substrate P held by the holder 31 in order to avoid the scattering of the liquid, and a liquid supply unit 36 which supplies the second liquid LQ2 onto the substrate P via a supply port 35A of a supply member 35. The substrate P, to which the pre-baking has been applied, is loaded on the holder 31 by the second transport system H2. Vacuum attraction holes, which constitute parts of a vacuum unit, are provided on the upper surface of the holder 31. The holder 31 attracts and holds the central portion of the lower surface of the substrate P. The rotating mechanism 32 includes an actuator such as a motor. The rotating mechanism 32 rotates the substrate P held by the holder 31 by rotating the shaft 33 connected to the holder 31. The rotating mechanism 32 rotates the holder 31 which holds the substrate P in the θZ direction in FIG. 5 at a predetermined number of revolutions per unit time. The supply member 35 is arranged over the substrate P held by the holder 31, which has the supply port 35A for supplying the second liquid LQ2. The second liquid LQ2, which is fed from the liquid supply unit 36, is supplied to the upper surface of the substrate P from the position over the substrate P via the supply port 35A of the supply member 35. The supply member 35 is movable in the directions of X axis, Y axis, Z axis, θX, θY, and θZ by means of an unillustrated driving mechanism. That is, the supply member 35 is movable relatively with respect to the substrate P held by the holder 31. The immersion unit 30 is capable of immersing the entire surface of the substrate P in the second liquid LQ2 by relatively moving the supply member 35 with respect to the substrate P. The immersion unit 30 is capable of adjusting, for example, the direction of the supply of the second liquid LQ2 to the substrate P and the distance between the supply port 35A and the substrate P by relatively moving the supply member 35 with respect to the substrate P. Further, the liquid supply unit 36 is capable of supplying the second liquid LQ2 onto the substrate P continuously or intermittently via the supply port 35A of the supply member 35. The liquid supply unit 36 is capable of adjusting, for example, the temperature of the second liquid LQ2 to be supplied and the amount (including the flow rate and the flow velocity) of the second liquid LQ2 to be supplied per unit time. The relative movement between the supply member 35 and the substrate P is not limited to the movement of the supply member 35. The substrate P may be moved, or both of the supply member 35 and the substrate P may be moved.

The immersion unit 30 supplies the second liquid LQ2 from the supply port 35A of the supply member 35 to the substrate P held by the holder 31 so that the substrate P is immersed in the second liquid LQ2. The photosensitive material 2, with which the upper surface 1A of the base material 1 of the substrate P is coated, is sufficiently immersed in the second liquid LQ2 supplied from the supply member 35.

In this embodiment, the immersion unit 30 continuously supplies the second liquid LQ2 from the supply member 35 while relatively moving the supply member 35 in the X axis direction with respect to the substrate P retained by the holder 31 while rotating, in the θZ direction in FIG. 5, the substrate P retained by the holder 31 by means of the rotating mechanism 32. Accordingly, the second liquid LQ2 is supplied to the substantially entire upper surface of the substrate P. Therefore, the immersion unit 30 is capable of immersing the substantially entire surface of the photosensitive material 2 with the second liquid LQ2. The ring-shaped member 34 is provided around the substrate P retained by the holder 31. Therefore, the scattering of the second liquid LQ2, which is caused by the rotation of the substrate P, can be avoided by the ring-shaped member 34.

In this embodiment, the second liquid LQ2, which is used for the immersion process, is the same as the first liquid LQ1 which is used to form the liquid immersion area LR formed on the substrate P in order to perform the liquid immersion exposure process. That is, in this embodiment, the second liquid LQ2 is pure (purified) water which is managed to have a predetermined purity (cleanness) and a predetermined temperature in the same manner as the first liquid LQ1. It is a matter of course that the second liquid LQ2 may be different from the first liquid LQ1 provided that the substance, which is to be eluted when the substrate P is immersed in the first liquid LQ1, can be previously eluted. For example, ozone water can be used as the second liquid LQ2.

Figure 6:
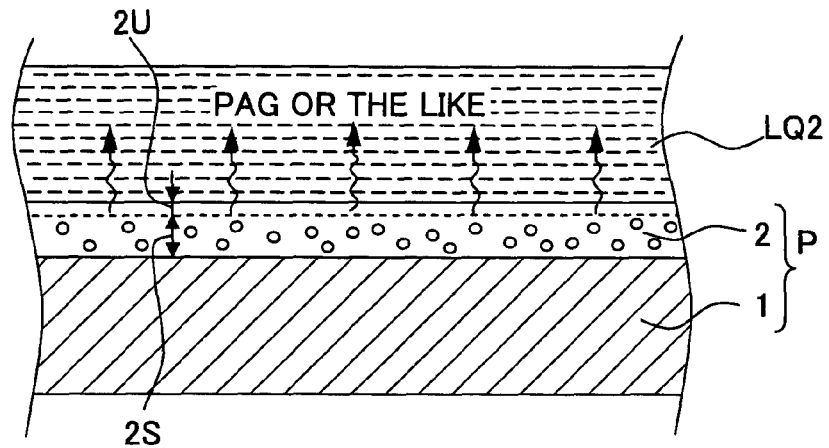
FIG. 6 schematically shows the behavior of the substrate for which the immersion process is performed.

FIG. 6 schematically shows a state in which the photosensitive material 2 of the substrate P is immersed in the second liquid LQ2. As described above, the photosensitive material 2 of this embodiment is the chemical amplification type resist. The chemical amplification type resist includes a base resin, a photo acid generator (PAG) which is contained in the base resin, and an amine-based substance which is called "quencher". When such a photosensitive material 2 makes contact with the liquid, parts of the components of the photosensitive material 2, specifically, for example, PAG and the amine-based substance are eluted into the liquid. In the following description, the substance (for example, PAG and the amine-based substance), which is contained in the photosensitive material 2 and which is possibly eluted into the liquid (LQ1, LQ2), is appropriately referred to as "predetermined substance".

With reference to FIG. 6, the photosensitive material 2 is immersed in the second liquid LQ2. It is assumed that the predetermined substance such as PAG and the amine-based substance is eluted into the second liquid LQ2. When the upper surface of the photosensitive material 2 makes contact with the second liquid LQ2, the predetermined substance (for example, PAG and the amine-based substance), which exists in a first area 2U having a predetermined thickness (for example, about 5 to 10 nm) from the upper surface of the photosensitive material 2, is eluted into the second liquid LQ2. However, the predetermined substance, which exists in a second area 2S as an underlying layer thereof, is not eluted into the second liquid LQ2 substantially. After a predetermined period of time (for example, about several seconds to several tens second) elapses after the contact between the upper surface of the photosensitive material 2 and the second liquid LQ2, the predetermined substance, which is eluted from the first area 2U to the second liquid LQ2, is substantially absent. That is, after the predetermined period of time elapses after the contact between the upper surface of the photosensitive material 2 and the second liquid LQ2, a state is given, in which almost all of the predetermined substance existing in the first area 2U of the photosensitive material 2 is eluted and exhausted. The predetermined substance is hardly eluted from the photosensitive material 2 to the second liquid LQ2. The predetermined period of time changes depending on the photosensitive material 2.

Therefore, even when the liquid immersion area LR of the first liquid LQ1 is formed on the substrate P (photosensitive material 2) is formed after being immersed in the second liquid LQ2 for the predetermined period of time, the predetermined substance is hardly eluted from the substrate P (photosensitive material 2) to the first liquid LQ1 as described later on.

After the immersion process is performed for the substrate P, the removal process is performed for the second liquid LQ2 on the substrate P (Step S4). When the removal process is performed for the second liquid LQ2, the immersion unit 30 stops the supply of the second liquid LQ2 by the liquid supply unit 36, or the immersion unit 30 gradually decreases the supply amount, while the holder 31, which holds the substrate P, is rotated by the rotating mechanism 32. The immersion unit 30 rotates the substrate P at a predetermined number of revolutions per unit time by using the rotating mechanism 32. Accordingly, the second liquid LQ2, which has been adhered to the substrate P, is scattered and removed from the substrate P by means of the action of the centrifugal force. That is, in this embodiment, the immersion unit 30 also has the function as the liquid removal mechanism for removing the second liquid LQ2.

In Step S3, the immersion condition for performing the immersion process for the substrate P is set depending on the information about the substrate P. The immersion condition includes the immersion time for immersing the substrate P in the second liquid LQ2, i.e., the time ranging from the contact of the second liquid LQ2 with the substrate P in Step S3 to the removal of the second liquid LQ2 from the surface of the substrate P in Step S4. The information about the substrate P includes the information about the photosensitive material 2. The information about the photosensitive material 2 includes the information about the material for forming the photosensitive material 2, and the elution time of a part of the predetermined substance of the photosensitive material 2 into the second liquid LQ2. The material for forming the photosensitive material 2 includes, for example, the base resin, PAG, and the amine-based substance as described above. The period of time (elution time), which ranges from the contact between the photosensitive material 2 and the second liquid LQ2 to the elution of almost all of the predetermined substance from the photosensitive material 2 (first area 2U of the photosensitive material 2), changes depending on, for example, the physical property of the material for forming the photosensitive material 2, and the content of the predetermined substance such as PAG. The period of time (elution time), which ranges from the contact between the photosensitive material 2 and the second liquid LQ2 to the start of the elution of the predetermined substance, also changes depending on the photosensitive material 2. Therefore, when the immersion condition, which includes the immersion time, is optimally set depending on the information about the substrate P including the information about the photosensitive material 2, almost all of the predetermined substance as described above can be eluted from the photosensitive material 2 (first area 2U) into the second liquid LQ2.

The immersion condition also includes the removal condition for the second liquid LQ2. The removal condition for the second liquid LQ2 is exemplified, for example, by the number of revolutions (velocity of rotation) per unit time of the substrate P brought about by the rotating mechanism 32, the rotation acceleration, and the time (rotation time) in which the rotation of the substrate P is executed. Further, the removal condition for the second liquid LQ2 also includes, for example, the rotation velocity profile and the rotation acceleration profile of the rotating mechanism 32. The time (i.e., the immersion time) in which the second liquid LQ2 makes contact with the substrate P and the behavior (for example, the movement velocity) of the second liquid LQ2 on the substrate P change depending on the removal condition for the second liquid LQ2. Therefore, when the removal condition for the second liquid LQ2 is optimally set depending on the information about the substrate P, almost all of the predetermined substance as described above can be eluted from the photosensitive material 2 (first area 2U) into the second liquid LQ2.

The immersion condition also includes the temperature of the second liquid LQ2 to be supplied. In the case of the procedure in which the second liquid LQ2 is supplied to the substrate P from the supply port 35A of the supply member 35 as in this embodiment, the immersion condition also includes the amount (including the flow rate and the flow velocity) per unit time of the second liquid LQ2 to be supplied, the supply pressure to be applied when the second liquid LQ2 is supplied, and the direction in which the second liquid LQ2 is allowed to flow with respect to the substrate P.

When the substrate P is immersed in the liquid (LQ1, LQ2), there is such a possibility that a part of the substance for constructing the base material 1 may be eluted into the liquid depending on the type of the substance for constructing the base material 1, without being limited to the predetermined substance contained in the photosensitive material 2. Therefore, the immersion unit 30 can also regard the possibility of the immersion of the base material 1 in the liquid (LQ1, LQ2) and the information about the material (substance) for forming the base material 1 as the information about the substrate P.

In this procedure, the immersion unit 30 supplies the second liquid LQ2 onto the substrate P while rotating the substrate P. However, it is possible to adopt any arrangement provided that the substrate P (photosensitive material 2) can be immersed in the second liquid LQ2. For example, a liquid bath may be previously filled with the second liquid LQ2, and the substrate P may be immersed in the second liquid LQ2 in the liquid bath. Alternatively, the substrate P may be immersed in the second liquid LQ2 by supplying the second liquid LQ2 to the substrate P so that the second liquid LQ2 is allowed to blow against the substrate P. In the case of the procedure in which the second liquid LQ2 is allowed to blow against the substrate P, the immersion condition also includes the pressure to be applied when the second liquid LQ2 is allowed to blow. The immersion condition is set depending on the information about the substrate P as well.

Figure 7:
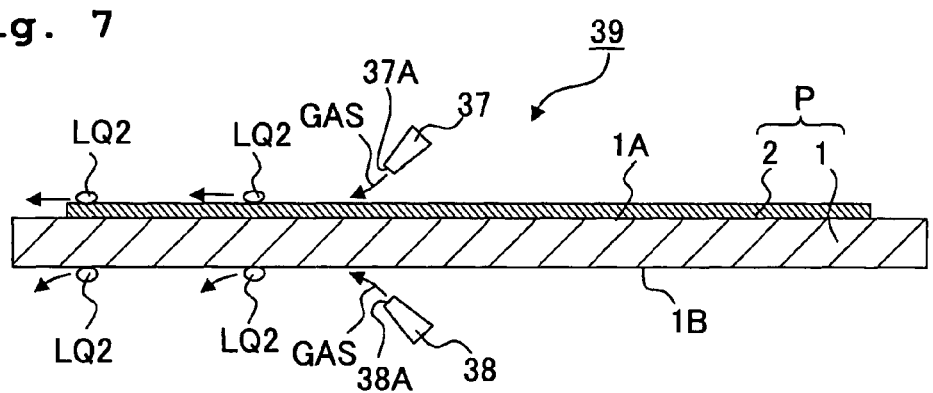
FIG. 7 shows an example of the operation for removing the liquid.

As shown in FIG. 7, the following arrangement may be also adopted for the liquid removal mechanism 39 for removing the second liquid LQ2 on the substrate P. That is, blow members 37, 38 having blow ports 37A, 38A, which allow the gas to blow therefrom, may be arranged on the upper surface side and the lower surface side of the substrate P respectively. The liquid removal mechanism 39 removes the second liquid LQ2 adhered to the substrate P by means of the force of the gas allowed to blow from the blow members 37, 38. When the second liquid LQ2 is removed by using the liquid removal mechanism 39, for example, the pressure and the gas supply amount (flow velocity) per unit time of the gas allowed to blow from the blow ports 37A, 38A can be also used as the immersion condition (removal condition).

After the second liquid LQ2 is removed from the substrate P, the temperature of the substrate P is adjusted by the temperature adjustment mechanism 40 (Step S5). When the second liquid LQ2, which remains on the substrate P, is removed by using the liquid removal mechanism 39, there is such a possibility that the temperature of the substrate P may be changed due to the heat of vaporization of the second liquid LQ2 to provide any temperature different from the desired temperature. Therefore, the temperature adjustment mechanism 40 adjusts the temperature of the substrate P in order to compensate the temperature change of the substrate P due to the heat of vaporization brought about when the second liquid LQ2 is removed. The temperature of the substrate P is adjusted so that the temperature is approximately same as the temperature of the substrate holder PH and/or the temperature of the first liquid LQ1. When the temperature of the substrate P is adjusted so that the temperature is approximately same as the temperature of the substrate holder PH, it is possible to suppress the expansion and the contraction of the substrate P which would be otherwise caused by the temperature change of the substrate P when the substrate P is loaded on the substrate holder PH. When the temperature of the substrate P is adjusted so that the temperature is approximately the same as the temperature of the first liquid LQ1, then it is possible to suppress the expansion and contraction of the substrate P which would be otherwise caused by the temperature change of the substrate P, and it is possible to suppress the temperature change of the first liquid LQ1 when the liquid immersion area LR of the first liquid LQ1 is formed on the substrate P.

Figure 8:
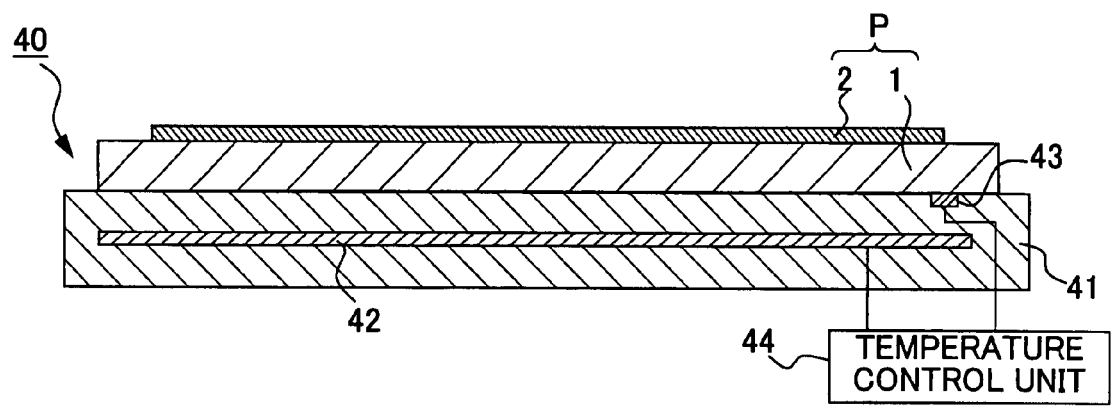
FIG. 8 shows an example of a temperature regulation mechanism.

FIG. 8 shows the temperature regulation mechanism 40. With reference to FIG. 8, the temperature adjustment mechanism 40 includes a holder 41 which holds the substrate P, a temperature adjustment unit 42 which includes a heating unit and a cooling unit provided in the holder 41, a temperature sensor 43 which measures the temperature of the substrate P held by the holder 41, and a temperature control unit 44 which adjusts the temperature of the holder 41 that holds the substrate P on the basis of the measurement result of the temperature sensor 43 by the aid of the temperature adjustment unit 42. The substrate P, which has been subjected to the immersion process, is loaded on the holder 41 by means of the second transport system H2. The temperature control unit 44 of the temperature adjustment mechanism 40 adjusts the temperature of the holder 41 by the aid of the temperature adjustment unit 42 on the basis of the measurement result of the temperature sensor 43 in a state in which the substrate P is held by the holder 41. Accordingly, the substrate P, which is held by the holder 41, can be adjusted to have a desired temperature.

Figure 9:
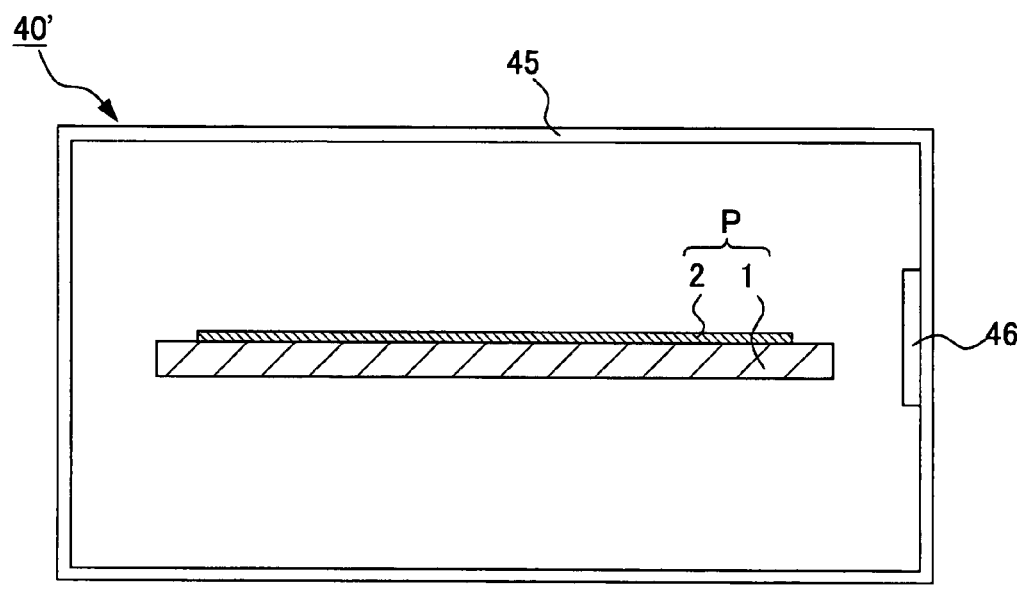
FIG. 9 shows another example of the temperature regulation mechanism.

As shown in FIG. 9, the following arrangement is also available. That is, a temperature adjustment mechanism 40' includes an accommodating chamber 45 which is capable of accommodating the substrate P, and a temperature adjustment unit 46 which adjusts the temperature in the accommodating chamber 45. The substrate P is arranged in the accommodating chamber 45 adjusted to have a desired temperature. As described above, the substrate P may be arranged in the atmosphere adjusted to have the desired temperature. Alternatively, the temperature of the substrate P may be adjusted by allowing the gas adjusted to have a predetermined temperature against the substrate P from the blow members 37, 38 as shown in FIG. 7.

The holder 31 of the immersion unit 30 as explained with reference to FIG. 5 may be allowed to have the temperature-adjusting function capable of adjusting the temperature of the held substrate P. The temperature of the substrate P may be adjusted by using the holder 31 of the immersion unit 30 after removing the second liquid LQ2 from the substrate P. Alternatively, the temperature of the substrate P may be adjusted by using the holder 31 of the immersion unit 30 before removing the second liquid LQ2 in consideration of the temperature change of the substrate P caused by the heat of vaporization brought about when the second liquid LQ2 is removed. In this procedure, the immersion unit 30 previously stores the relationship between the information about the second liquid LQ2 including, for example, the removal condition and the physical property of the second liquid LQ2 to be used and the temperature change of the substrate P caused by the heat of vaporization brought about when the second liquid LQ2 is removed. The relationship can be previously determined, for example, by an experiment or simulation. The immersion unit 30 can predict the temperature change of the substrate P caused by the heat of vaporization brought about when the second liquid LQ2 is removed, on the basis of the stored relationship and the removal condition under which the removal process is executed for the second liquid LQ2. The immersion unit can provide a desired value of the temperature of the substrate P after removing the second liquid LQ2 by adjusting the temperature of the substrate P before removing the second liquid LQ2 from the substrate P on the basis of the predicted result. For example, the immersion unit 30 can set the temperature of the substrate P so that the temperature is higher than a desired value in consideration of the decrease in the temperature of the substrate P caused by the heat of vaporization brought about when the second liquid LQ2 is removed. Of course, the temperature of the substrate P, which is caused by the heat of vaporization brought about when the second liquid LQ2 is removed in the immersion unit 30, may be compensated by adjusting the temperature of the substrate P before placing the substrate P on the holder 31 of the immersion unit 30.

After the temperature of the substrate P is adjusted, the second transport system H2 unloads the substrate P out of the temperature regulation mechanism 40. The substrate P is delivered via the interface IF to the first transport system H1 of the exposure apparatus EX-SYS. The first transport system H1 transports (loads) the substrate P onto the substrate holder PH of the main exposure apparatus body EX (Step S6).

The control unit CONT of the exposure apparatus EX-SYS forms the liquid immersion area LR of the first liquid LQ1 on the substrate P in the state of being held by the substrate holder PH, by using the liquid immersion mechanism 100. The control unit CONT radiates the exposure light beam EL onto the substrate P in the state of being held by the substrate holder PH through the first liquid LQ1 to perform the liquid immersion exposure for the substrate P (Step S7).

Figure 10:
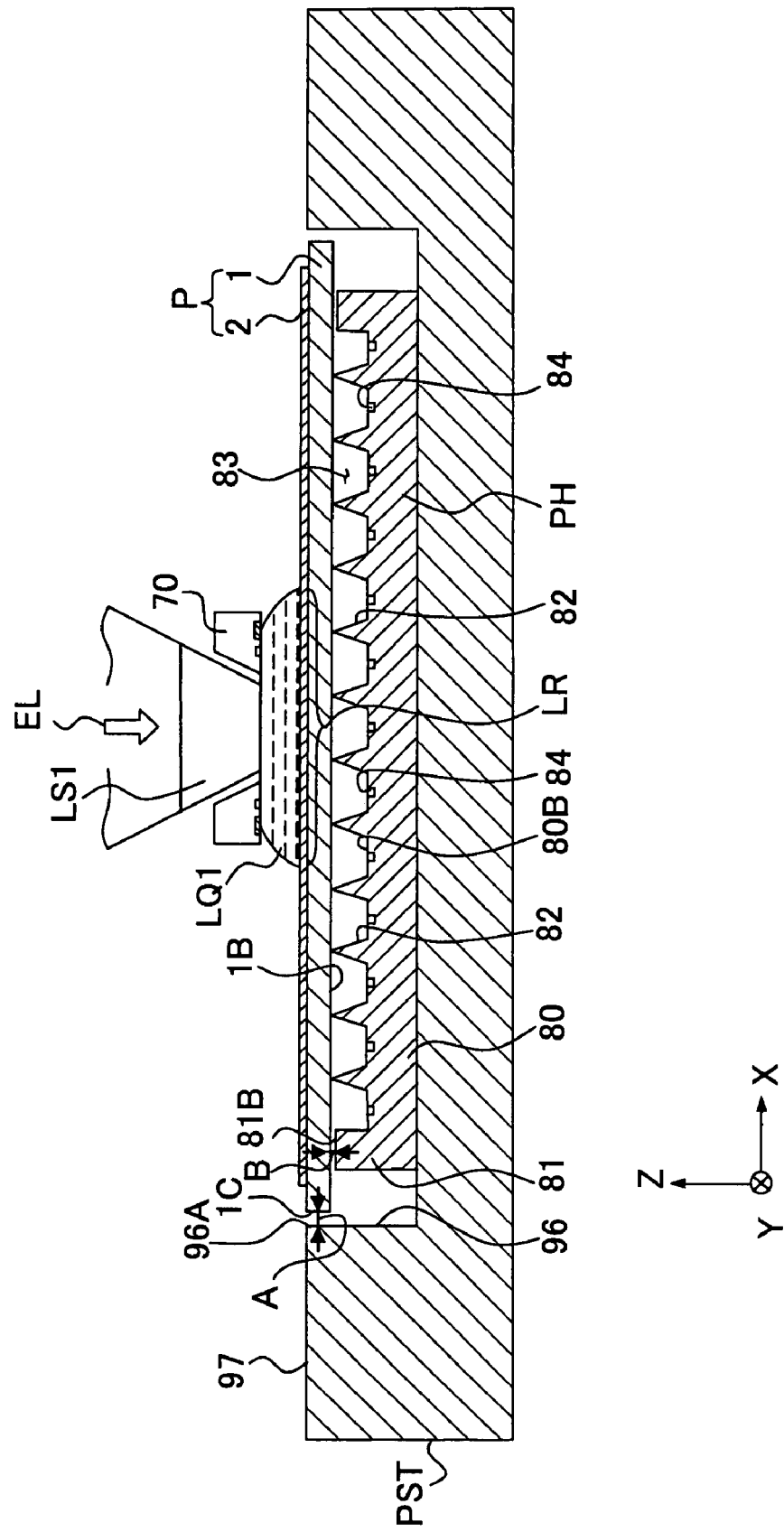
FIG. 10 shows a state in which the substrate held by a substrate holder is subjected to the liquid immersion exposure.

FIG. 10 shows a state wherein the substrate P, which is held by the substrate holder PH of the substrate stage PST, is subjected to the liquid immersion exposure. With reference to FIG. 10, the substrate stage PST has the recess 96. The substrate holder PH for holding the substrate P is provided inside the recess 96. The substrate holder PH includes a base member 80 which has a bottom surface portion 80B opposed to the lower surface of the substrate P (lower surface 1B of the base material 1) while being away therefrom by a predetermined distance, a circumferential wall portion 81 which is formed on the base member 80 and which has an upper surface 81A opposed to the lower surface of the substrate P, and support portions 82 which are formed on the bottom surface 80B disposed inside the circumferential wall portion 81. The circumferential wall portion 81 is formed to be substantially annular in conformity with the shape of the substrate P. The upper surface 81A of the circumferential wall portion 81 is formed opposingly to the circumferential edge portion of the lower surface of the substrate P. The upper surface 81A of the circumferential wall portion 81 is a flat surface. The plurality of support portions 82 of the substrate holder PH are provided uniformly at the inside of the circumferential wall portion 81. The support portions 82 include a plurality of support pins. The substrate holder PH has the so-called pin-chuck mechanism. The pin-chuck mechanism of the substrate holder PH includes a suction mechanism which is provided with suction ports 84 for providing the negative pressure in the space 83 surrounded by the base member 80 of the substrate holder PH, the circumferential wall portion 81, and the substrate P. The substrate P is attracted and held by the support portions 83 by providing the negative pressure in the space 83. The plurality of suction ports 84 are provided uniformly on the bottom surface 80B of the base member 80. A gap A, which has a distance of about 0.1 to 1.0 mm, is formed between the side surface of the substrate P (side surface 1C of the base material 1) held by the substrate holder PH and the inner side surface 96A of the recess 96 of the substrate stage PST provided around the substrate P. In this embodiment, the upper surface 81A of the circumferential wall portion 81 is the flat surface. The upper surface 81A is coated with a liquid-repellent material such as a fluorine-based rein material to have the liquid repellence. A predetermined gap B is formed between the upper surface 81A of the circumferential wall portion 81 and the lower surface of the substrate P.

In this embodiment, the substrate P is immersed in the second liquid LQ2 in Step S3 before radiating the exposure light beam EL onto the substrate P through the first liquid LQ1. Therefore, even when the first liquid LQ1 is allowed to make contact again with the photosensitive material 2 subjected to the immersion process with the second liquid LQ2 as described above, the predetermined substance (for example, PAG) is scarcely eluted from the photosensitive material 2 to the first liquid LQ1.

Figure 11:
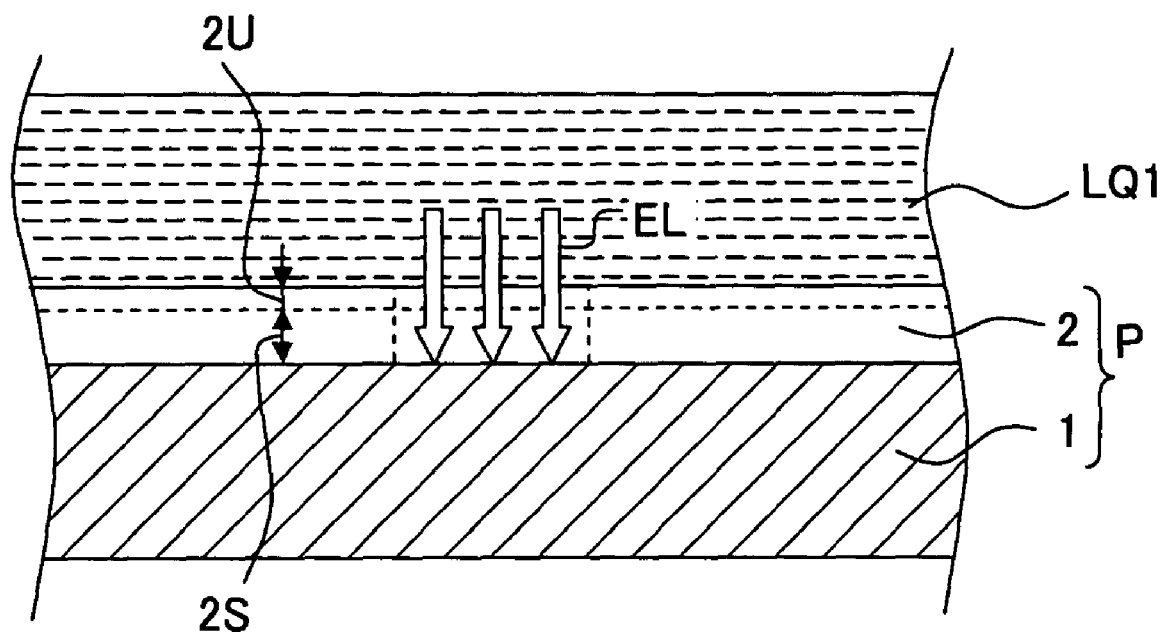
FIG. 11 schematically shows a state in which the exposure light beam is radiated onto the substrate.

PAG is scarcely present in the first area 2U of the photosensitive material 2. However, as schematically shown in FIG. 11, the exposure light beam EL, which is radiated onto the photosensitive material 2 of the substrate P, can pass through the first area 2U to arrive at the second area 2S in which PAG is present.

After the completion of the liquid immersion exposure for the substrate P, the control unit CONT stops the supply of the first liquid LQ1 by the liquid supply mechanism 10. Further, the control unit CONT continues the driving of the liquid recovery mechanism 20 to recover and remove the first liquid LQ1 on the substrate P and the substrate stage PST. Subsequently, the control unit CONT unloads the substrate P out of the substrate holder PH by using the first transport system H1.

The substrate P, which is unloaded out of the substrate holder PH and which has been subjected to the exposure process, is subjected to a heat treatment (post-baking) called PEB (Post Exposure Bake) (Step S8). In the case of the chemical amplification type resist, acid is generated from PAG by being irradiated with the exposure light beam EL. When the post-baking is performed for the chemical amplification type resist after being irradiated with the exposure light beam EL, the alkali solubility is expressed in the area corresponding to the radiation area of the exposure light beam EL (pattern of the mask M). The post-bake can be performed for the substrate P by using the temperature adjustment mechanism 40 provided for the coater/developer apparatus C/D-SYS as explained with reference to, for example, FIGS. 8 and 9. Therefore, the substrate P, for which the exposure process has been completed, is unloaded out of the substrate holder PH by the first transport system H1, and then the substrate P is delivered to the second transport system H2 via the interface IF. The second transport system H2 loads the substrate P to the holder 41 of the temperature adjustment mechanism 40. The temperature adjustment mechanism 40 performs the post-baking for the substrate P loaded on the holder 41. In this embodiment, the temperature adjustment mechanism 40 is used to perform both of the post-baking process after the exposure for the substrate P and the temperature adjustment for the substrate P after removing the liquid by means of the liquid removal mechanism. However, it is a matter of course that these procedures may be performed with distinct temperature adjustment mechanisms respectively.

Figure 12:
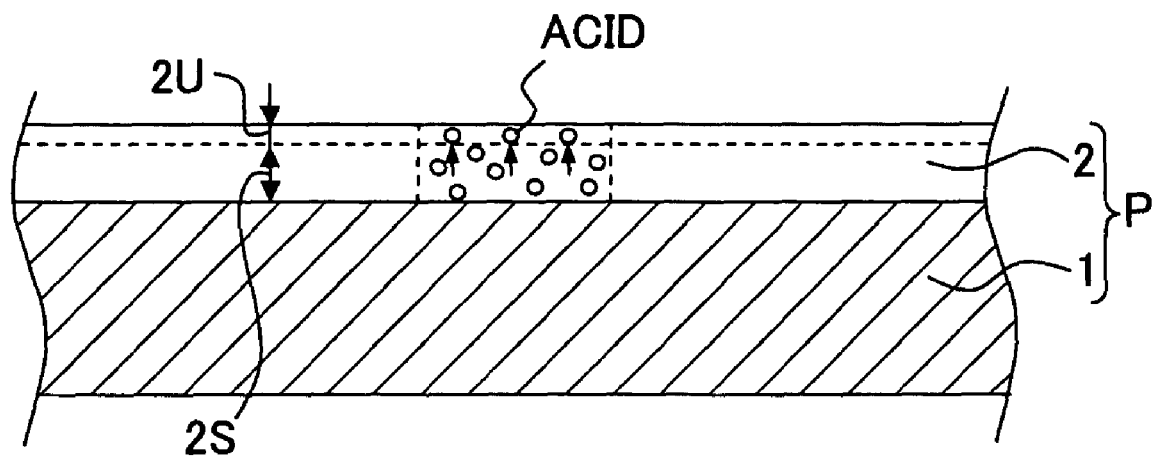
FIG. 12 schematically shows the behavior of the substrate for which the heat treatment is performed.

FIG. 12 schematically shows the behavior of the photosensitive material 2 for which the post-baking (PEB) is performed. Owing to the immersion process performed in Step S3, PAG scarcely exists in the first area 2U of the photosensitive material 2. Therefore, any acid, which results from PAG, is hardly generated in the first area 2U of the photosensitive material 2 after radiating the exposure light beam EL onto the photosensitive material 2. On the other hand, a sufficient amount of PAG exists in the second area 2S of the photosensitive material 2. Therefore, a sufficient amount of acid is generated from PAG in the second area 2S by being irradiated with the exposure light beam EL. When the post-baking is performed to the substrate P including the photosensitive material 2 in the state as described above, a phenomenon occurs as shown in FIG. 12, in which the acid, which exists in the second area 2S, is diffused to the first area 2U. That is, the acid is scarcely present in the first area 2U after the exposure. However, when the post-baking is performed, the first area 2U is supplemented with the acid existing in the second area 2S. When the post-baking is further continued in the state in which the first area 2U is supplemented with the acid, it is possible to express the alkali solubility in the area of the photosensitive material 2 corresponding to the radiation area of the exposure light beam EL (pattern of the mask M).

The substrate P, to which the post-baking has been performed, is transported to the main coater/developer body C/D by the second transport system H2, and the development process is performed therefor (Step S9).

As explained above, the substrate P is immersed in the second liquid LQ2 before radiating the exposure light beam EL onto the substrate P through the first liquid LQ1. Accordingly, it is possible to suppress the elution of the predetermined substance such as PAG into the first liquid LQ1 of the liquid immersion area LR during the liquid immersion exposure for the substrate P. If the predetermined substance such as PAG is eluted into the first liquid LQ1, the first liquid LQ1 is polluted, and the polluted first liquid LQ1 is dried, then it is feared that the adhesion trace (water mark), which results from the predetermined substance, may be formed on the substrate P. However, substantially no predetermined substance is eluted from the substrate P into the first liquid LQ1 of the liquid immersion area LR. Therefore, even when the first liquid LQ1, which remains on the substrate P, is dried, it is possible to suppress the occurrence of the inconvenience which would be otherwise caused such that the adhesion trace is formed on the substrate P.

The inconvenience of the formation of the adhesion trace on the substrate P including the photosensitive material 2 is avoided. Accordingly, even when the development process is performed, it is possible to avoid the occurrence of the pattern defect. Therefore, it is possible to produce the device having the desired performance.

The pollution (contamination) of the first liquid LQ1 of the liquid immersion area LR is avoided. Therefore, it is also possible to avoid the pollution of, for example, the nozzle member 70 to make contact with the first liquid LQ1, the first optical element LS1, the upper surface 97 of the substrate stage PST, the substrate holder PH, and the optical measuring unit provided on the upper surface 97 of the substrate stage PST. It is possible to accurately perform the exposure process and the measurement process.

In Step S3, the predetermined substance such as PAG is eluted into the second liquid LQ2 in which the substrate P is immersed. The second liquid LQ2 is polluted with the predetermined substance. However, in Step S4, the second liquid LQ2 is removed from the substrate P. Therefore, it is possible to avoid the generation of the foreign matter (adhered matter) on the substrate P. When the liquid is removed from the substrate P after cleaning out the polluted second liquid LQ2 with the clean second liquid LQ2, it is possible to suppress the generation of the foreign matter (adhered matter) on the substrate P even when the remaining second liquid LQ2 is dried, because the concentration of the pollutant (eluted matter) is lowered in the second liquid LQ2, even if droplets or the like of the second liquid LQ2 remain on the substrate P.

In this embodiment, the immersion unit 30 is provided for the coater/developer apparatus C/D-SYS. However, it is a matter of course that the immersion unit 30 is provided for the exposure apparatus EX-SYS. For example, the immersion unit 30 may be provided at an intermediate position of the transport passage of the first transport system H1 for constructing the exposure apparatus EX-SYS. Accordingly, the substrate P before the liquid immersion exposure process can be immersed in the second liquid LQ2 in the exposure apparatus EX-SYS. Alternatively, the immersion unit 30 may be provided for the interface IF. On the other hand, the temperature adjustment mechanism 40 may be provided for the exposure apparatus EX-SYS as well. Accordingly, the temperature of the substrate P can be adjusted by using the temperature adjustment mechanism 40 in order to compensate the temperature change of the substrate P caused by the heat of vaporization brought about when the second liquid LQ2 is removed in the exposure apparatus EX-SYS. The temperature adjustment mechanism 40 can be also provided at an intermediate position of the transport passage of the first transport system H1, in the same manner as the immersion unit 30. It is a matter of course that the temperature adjustment mechanism 40 can be provided for the interface IF as well.

It is desirable that the temperature adjustment mechanism 40 is installed in the vicinity of the immersion unit 30 (liquid removal mechanism). However, the immersion unit 30 may be arranged for the coater/developer apparatus C/D-SYS, and the temperature adjustment mechanism 40 may be arranged for the exposure apparatus EX-SYS.

The temperature adjustment may be omitted after the immersion process when it is unnecessary to compensate the temperature change of the substrate P caused by the heat of vaporization and/or when the temperature change of the substrate P, which is caused by the heat of vaporization, is small to an allowable extent.

In this embodiment, the immersion unit 30 is provided at the intermediate position of the transport passage of the transport system H (H1, H2). The substrate P is immersed in the second liquid LQ2 before holding the substrate P by the substrate holder PH. However, the liquid immersion mechanism 100 may be allowed to have the function as the immersion unit, and the substrate P may be immersed in the first liquid LQ1 after holding the substrate P by the substrate holder PH. That is, the following step may be provided. The substrate P is loaded and held by the substrate holder PH, and then the first liquid LQ1 is supplied onto the substrate P from the supply port 12 of the nozzle member 70 before starting the liquid immersion exposure for the substrate P. The substrate P is immersed by using the supplied first liquid LQ1. The control unit CONT supplies and recovers the first liquid LQ1 via the recovery port 22 and the supply port 12 of the nozzle member 70, while the substrate P, which is held by the substrate holder PH, is relatively moved in the XY directions with respect to the nozzle member 70. Accordingly, a wide area of the upper surface of the substrate P can be immersed with the first liquid LQ1. After the completion of the immersion process, the control unit CONT recovers (removes) the first liquid LQ1 from the substrate P by using the liquid recovery mechanism 20. After the completion of the removal of the first liquid LQ1, the liquid immersion area LR of the first liquid LQ1 is formed again on the substrate P by using the liquid immersion mechanism 100. The substrate P is exposed through the first liquid LQ1. When the arrangement as described above is adopted, the immersion process can be performed for the substrate P without providing the immersion unit 30 at the intermediate position of the transport passage of the transport system H. Therefore, it is possible to simplify the apparatus structure, and it is possible to reduce the apparatus cost.

It is also desirable that the liquid immersion condition is optimized on the basis of the information about the substrate P when the immersion process is performed by using the liquid immersion mechanism 100. It is necessary that the liquid immersion condition is set so that any harmful influence is not exerted, for example, on the first optical element LS1, when the immersion process is performed by using the liquid immersion mechanism 100. For example, when the immersion process is performed for the substrate P by using the liquid immersion mechanism 100, it is appropriate that the supply amount and the recovery amount per unit time of the first liquid LQ1 by the liquid immersion mechanism 100 are larger than the supply amount and the recovery amount per unit time of the first liquid LQ1 during the liquid immersion exposure. Accordingly, it is possible to quicken the flow velocity of the first liquid LQ1 on the substrate P during the immersion process as compared with the flow velocity of the first liquid LQ1 on the substrate P during the liquid immersion exposure. Therefore, the pollutant, which is eluted into the first liquid LQ1, can be quickly recovered from the recovery port 22 during the immersion process. It is possible to avoid the adhesion of the foreign matter resulting from the predetermined substance eluted from the substrate P, for example, on the substrate P, the upper surface 97 of the substrate stage PST, and the first optical element LS1.

In the operation described above, all of the first liquid LQ1, which forms the liquid immersion area LR, is recovered after the immersion process based on the use of the liquid immersion mechanism 100, and the liquid immersion area LR is formed again with the first liquid LQ1. However, the liquid immersion exposure process (exposure step) may be performed continuously to the immersion process (immersion step) while forming the liquid immersion area LR (for example, while continuing the supply and the recovery of the liquid). In this procedure, the period of time, in which the substrate is immersed in the first liquid, may be managed, and the exposure may be started after the elapse of time in which the predetermined substance is completely eluted. That is, the object of the present invention can be also achieved by supplying the liquid onto the substrate P and starting the liquid immersion exposure after the elapse of a period of time sufficient for the predetermined substance to be eluted from the substrate P. However, it is desirable that the cleaning or recovery operation for the liquid is performed while maintaining the liquid immersion area, because the eluted predetermined substance is contained in the liquid.

In this embodiment, at least a part of the first liquid LQ1 (and/or the second liquid LQ2), which is recovered by the liquid recovery mechanism 20, may be returned to the liquid supply mechanism 10. Alternatively, all of the first liquid LQ1 (or the second liquid LQ2), which is recovered by the liquid recovery mechanism 20, may be discarded, and the new clean first liquid LQ1 (and/or the second liquid LQ2) may be supplied from the liquid supply mechanism 10. The structure of the liquid immersion mechanism 1 including, for example, the nozzle member 70 is not limited to the structure as described above. For example, it is also possible to use those described in European Patent Publication No. 1420298 and International Publication Nos. 2004/055803, 2004/057589, 2004/057590, and 2005/029559.

The second liquid LQ2, which is distinct from the first liquid LQ1, may be also used when the immersion process is performed by using the liquid immersion mechanism 100.

In the first embodiment, it is possible to more effectively avoid the generation of the foreign matter (adhered matter) on the substrate P by arranging a liquid removal mechanism for removing the liquid remaining on the substrate P unloaded out of the substrate holder PH after the liquid immersion exposure for the substrate P having been subjected to the immersion process. For example, as shown in FIG. 7, it is possible to arrange the mechanism which removes the liquid by allowing the gas to blow against the front surface and the back surface of the substrate P. In this arrangement, the blow ports 37A, 38A for the gas may be arranged in the vicinity of the circumference of the substrate P to remove only the liquid remaining in the vicinity of the circumferential edge of the substrate P by rotating the substrate P. In this case, a detection unit, which detects the liquid remaining on the substrate P unloaded out of the substrate holder PH after the liquid immersion exposure for the substrate P, may be arranged. When the liquid on the substrate P is detected, the liquid removal operation may be executed for the substrate P by using the liquid removal mechanism as described above. In the first embodiment described above, the substrate P is immersed in the second liquid LQ2 before the exposure step, and substantially all of the predetermined substance is eluted from the substrate P into the second liquid LQ2. However, it is also allowable that substantially all of the predetermined substance is not eluted from the substrate P into the second liquid LQ2, if permitted, on condition that the amount of elution of the predetermined substance into the first liquid LQ1 is small.

Second Embodiment

Figure 13:
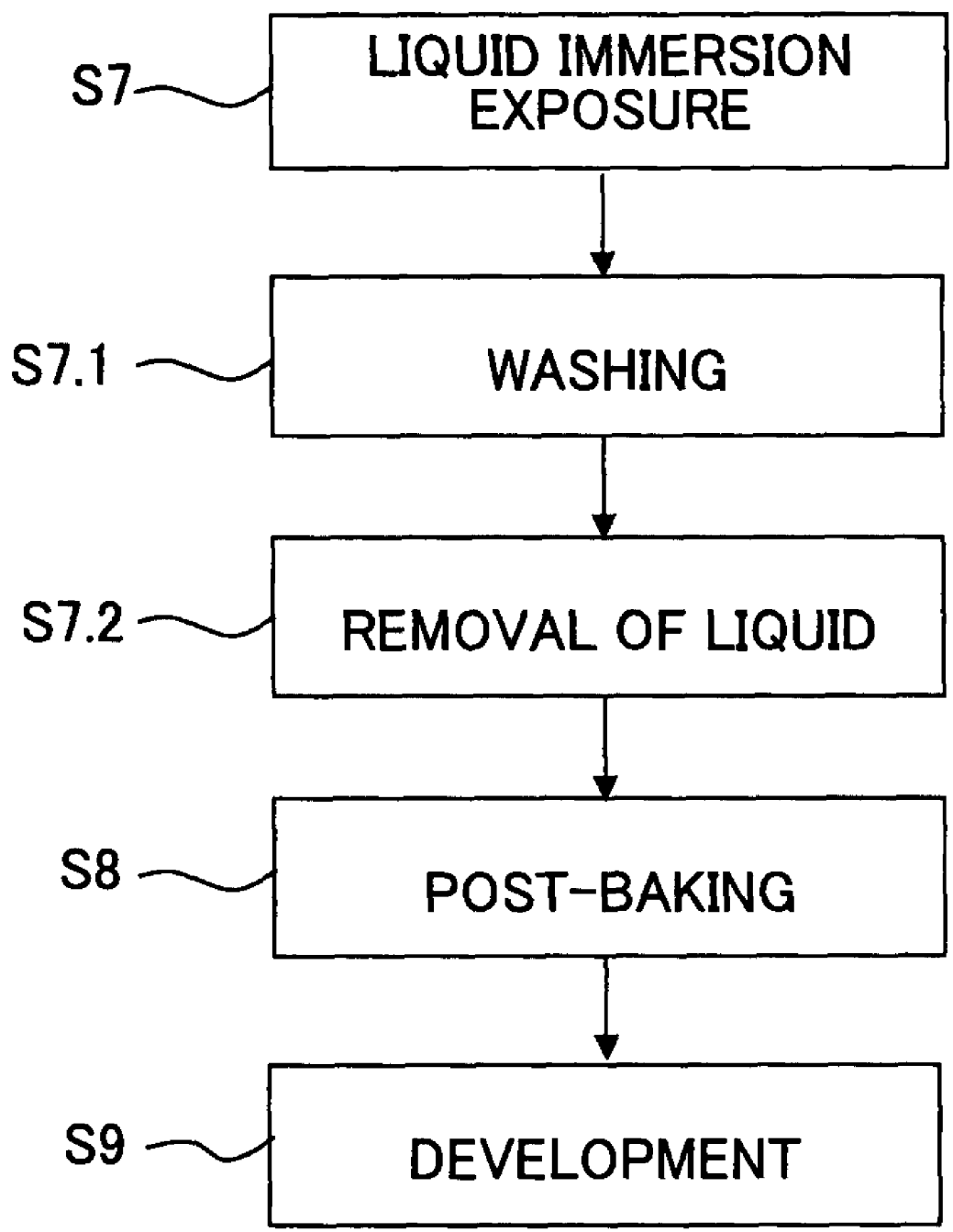
FIG. 13 shows a flow chart illustrating an example of the operation of a device production system according to a second embodiment.

Next, a second embodiment will be explained with reference to a flow chart shown in FIG. 13. In the following description, the constitutive components, which are the same as or equivalent to those described in the first embodiment, are designated by the same reference numerals, any explanation of which will be simplified or omitted.

The feature of the second embodiment resides in the fact that a cleaning process is performed to the substrate P after the completion of the liquid immersion exposure. The following explanation will be made assuming that the immersion process is not performed for the substrate P before performing the liquid immersion exposure for the substrate P. However, it is a matter of course that the cleaning process may be applied as described below after performing the liquid immersion exposure for the substrate P to which the immersion process has been applied. That is, in the exposure apparatus and the exposure method of this embodiment, the immersion unit and the immersion step are not essential.

The liquid immersion process is performed to the substrate P in the state in which the substrate P is held by the substrate holder PH (Step S7) in the same manner as in the embodiment described above.

After the completion of the liquid immersion exposure process, the cleaning process is performed for cleaning the substrate P while holding the substrate P by the substrate holder PH (Step 7.1). The control unit CONT moves the substrate P held by the substrate holder PH relatively with respect to the nozzle member 70 to clean the substrate P with the first liquid LQ1 while the first liquid LQ1 is retained on the image plane side of the projection optical system PL while supplying and recovering the first liquid LQ1 by means of the liquid immersion mechanism 100.

The predetermined substance is eluted from the substrate P, especially from the photosensitive material thereof into the first liquid LQ1 of the liquid immersion area LR during the liquid immersion exposure for the substrate P. It is feared that any foreign matter may be adhered onto the substrate P due to the predetermined substance (eluted matter) eluted into the first liquid LQ1. The control unit CONT can decrease or miniaturize (decompose, pulverize into fine particles, and/or convert to have fine and minute sizes) or remove the foreign matter adhered onto the substrate P resulting from the eluted matter eluted from the substrate P into the first liquid LQ1 by cleaning, with the first liquid LQ1, the substrate P after making the contact with the first liquid LQ1 for forming the liquid immersion area LR. Therefore, it is possible to avoid the inconvenience which would be otherwise caused such that the adhesion trace is formed on the substrate P. The foreign matter, which is adhered onto the substrate P resulting from the predetermined substance (eluted matter) eluted into the first liquid LQ1, means the "predetermined substance" itself including the component of the photosensitive material such as PAG and the amine-based substance as described in the first embodiment as well as the substance generated by the modification, the bonding, and/or the decomposition of the "predetermined substance" as described above. The substance as described above can be identified by detecting, for example, the functional group inherent in PAG or the amine-based substance itself or any compound thereof by means of an analysis method such as the infrared spectroscopic analysis and the TOF-SIMS analysis.

FIG. 14 shows a plan view schematically illustrating a state in which the substrate P is cleaned. The control unit CONT supplies the first liquid LQ1 from the supply port 12 of the nozzle member 70 and recovers the first liquid LQ1 from the recovery port 22 while relatively moving the nozzle member 70 and the substrate P held by the substrate holder PH in the XY directions as indicated by the arrows y1, y2 shown in FIG. 14. Accordingly, the substantially entire region of the upper surface of the substrate P can be satisfactorily cleaned.

The base material 1 is exposed at the circumferential edge portion 1As of the substrate P of this embodiment. Therefore, the control unit CONT preponderantly cleans the circumferential edge portion 1As of the substrate P held by the substrate holder PH by using the first liquid LQ1 supplied from the supply port 12 of the nozzle member 70.

Figure 15:
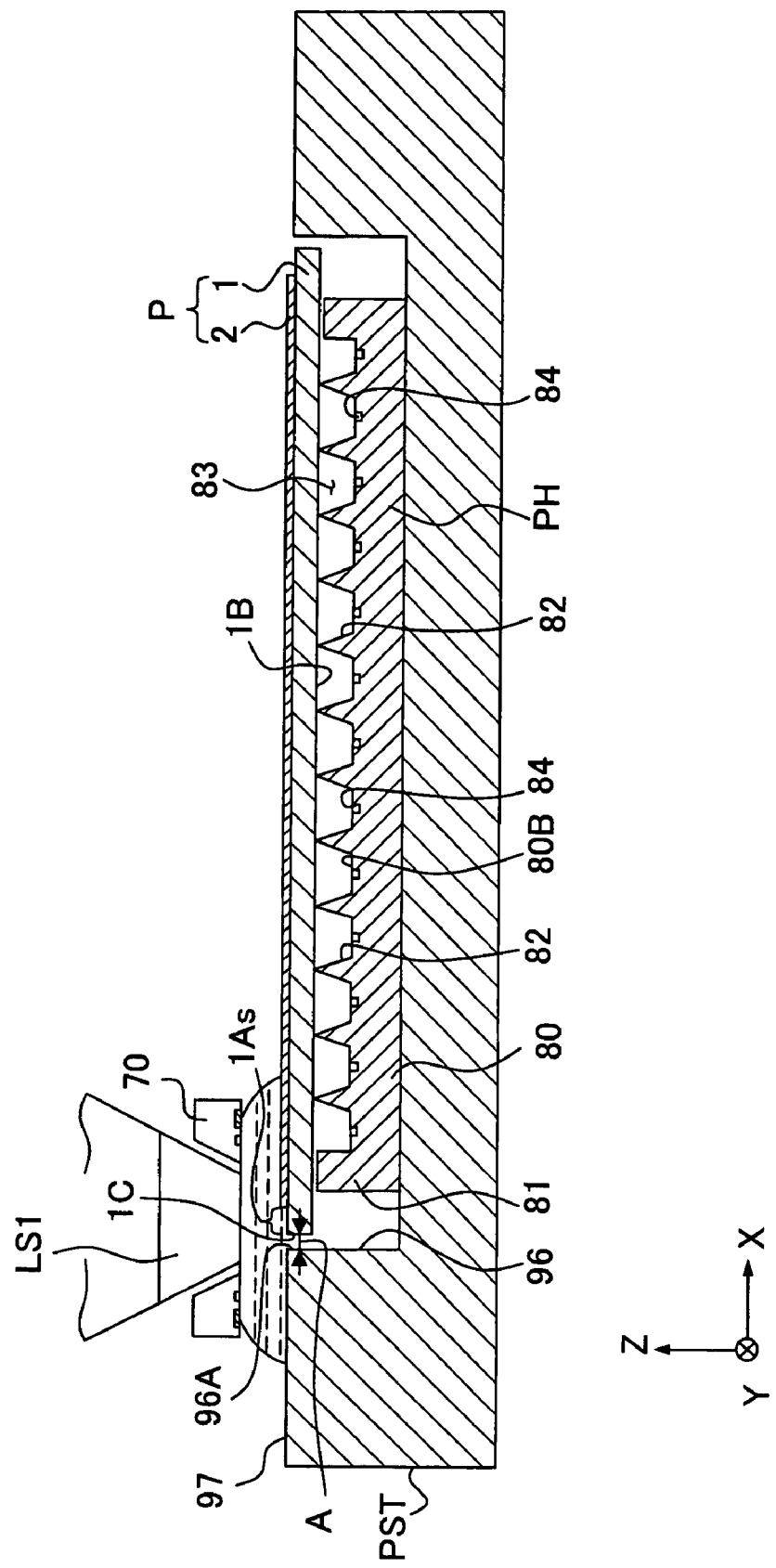
FIG. 15 shows a side sectional view illustrating an example of the operation for cleaning the substrate.

FIG. 15 shows a sectional view illustrating a state in which the circumferential edge portion 1As of the substrate P is cleaned. When the circumferential edge portion 1As of the substrate P is cleaned with the first liquid LQ1, the control unit CONT forms the liquid immersion area LR of the first liquid LQ1 on the circumferential edge portion 1As of the substrate P. The nozzle member 70 and the substrate stage PST are relatively moved, and the liquid immersion area LR of the first liquid LQ1 is moved along the circumferential edge portion 1As (gap A) which is formed to be substantially annular, as indicated by the arrow y3 shown in FIG. 14. The number of the movement of the liquid immersion area LR along the arrow y3 is not limited to one (one round). The movement can be executed arbitrarily a plurality of times (a plurality of rounds).

The base material 1 has the lyophilicity or liquid-attracting property with respect to the liquid LQ1 as compared with the photosensitive material 2 in many cases. Therefore, there is such a high possibility that the liquid LQ1, which is used for the liquid immersion exposure, remains on the side surface 1C and/or the circumferential edge portion 1As as the exposed portion of the base material 1. Further, there is such a high possibility that the first liquid LQ1, which remains on the circumferential edge portion 1As, is dried, the foreign matter is adhered to the circumferential edge portion 1As of the base material 1, and the adhesion trace is formed. Accordingly, the circumferential edge portion 1As of the base material 1 is preponderantly cleaned after the liquid immersion exposure. Thus, it is possible to avoid the inconvenience of the adhesion of the foreign matter to the circumferential edge portion 1As of the substrate P. Consequently, it is possible to avoid the inconvenience of the formation of the adhesion trace. In other situations, even when the foreign matter is adhered to the circumferential edge portion 1As, the foreign matter can be decreased or miniaturized or removed. Further, it is possible to avoid the adhesion of the foreign matter to the side surface of the substrate P (side surface 1C of the base material 1) by moving the liquid immersion area LR of the first liquid LQ1 along the gap A. Even when the foreign matter is adhered, it is possible to decrease or miniaturize or remove the adhered foreign matter.

The cleaning process is performed for a predetermined period of time in the state in which the substrate P is held by the substrate holder PH. After that, the control unit CONT recovers and removes the first liquid LQ1 used for the cleaning process, by using the liquid recovery mechanism 20 (Step S7.2). Subsequently, the substrate P, to which the cleaning process has been applied, is unloaded by the control unit CONT by using the first transport system H1. The pollution of the first transport system H1 is suppressed when the substrate P is unloaded, because the cleaning process has been performed for the substrate P on the substrate holder PH. The post-baking (Step S8) and the development process (Step S9) are performed for the substrate P in the same manner as in the embodiment described above.

As described above, the cleaning process is performed for the substrate P by using the first liquid LQ1 supplied from the supply port 12 of the nozzle member 70 in the state in which the substrate P is held by the substrate holder PH before the substrate P, which has been subjected to the exposure process, is unloaded out of the substrate holder PH. Therefore, it is possible to remove or decrease or miniaturize the foreign matter (adhered matter) adhered to the substrate P. Even when the droplets or the like of the first liquid LQ1 remain on the substrate P after the cleaning process, the concentration of the pollutant (eluted substance) is lowered in the first liquid LQ1 remaining on the substrate P owing to the cleaning process. Therefore, even when the remaining first liquid LQ1 is dried, it is possible to avoid (control) the appearance of the foreign matter (adhered matter) on the substrate P. Therefore, the pollution of the transport system H is not only avoided, but the occurrence of the pattern defect can be also avoided even when the development process is performed with the coater/developer apparatus C/D-SYS. It is also possible to avoid the pollution of the substrate-accommodating container when the substrate P is transported to the substrate-accommodating container from the substrate stage PST (substrate holder PH). In particular, the circumferential edge portion of the substrate P is preponderantly cleaned in this embodiment. Therefore, it is possible to effectively avoid the pollution of the substrate-accommodating container and the transport system for supporting the circumferential edge portion of the substrate P.

The second liquid LQ2, which is different from the first liquid LQ1, may be used for the cleaning process in the second embodiment. In this case, the first liquid LQ1 may be recovered after the liquid immersion exposure process based on the use of the first liquid LQ1, and the second liquid LQ2 may be supplied and recovered by using the liquid immersion mechanism 100. A liquid, which contains a component having the cleaning function, may be used for the second liquid LQ2. The second liquid LQ2 may be prepared by containing, for example, a component having the cleaning function such as a surfactant and/or a water-soluble organic solvent in the liquid which is of the same type as that of the first liquid.

Third Embodiment

Next, a third embodiment will be explained. The feature of the third embodiment resides in the fact that the substrate P, for which the liquid immersion exposure has been completed, is unloaded out of the substrate holder PH, and then the substrate P is cleaned with the second liquid LQ2. Also in this embodiment, the second liquid LQ2 for the cleaning process is the same as the first liquid LQ1 for the liquid immersion exposure process.

Figure 16:
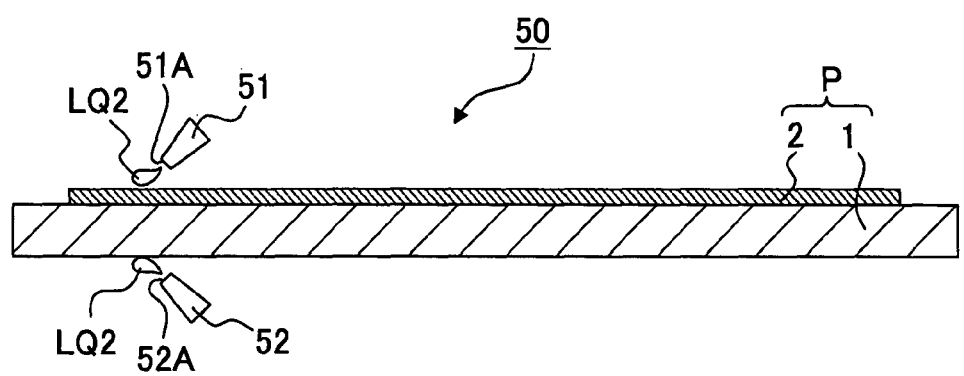
FIG. 16 shows an example of the operation for cleaning the substrate according to a third embodiment.

FIG. 16 schematically shows a cleaning unit 50 for cleaning the substrate P after being unloaded out of the substrate holder PH. The cleaning unit 50 is provided at an intermediate position of the second transport system H2 of the coater/developer apparatus C/D-SYS. The cleaning unit 50 is capable of cleaning the upper surface of the substrate P and the lower surface of the substrate P (lower surface 1B of the base material 1).

The cleaning unit 50 comprises a first supply member 51 which is arranged over the substrate P and which has a supply port 51A for supplying the second liquid LQ2 to the upper surface of the substrate P, and a second supply member 52 which is arranged under the substrate P and which has a supply port 52A for supplying the second liquid LQ2 to the lower surface of the substrate P. The substrate P is held by an unillustrated holder. The first and second supply members 51, 52 and the substrate P are movable relatively to one another. When the second liquid LQ2 is supplied to the substrate P from the first and second supply members 51, 52 while relatively moving the first and second supply members 51, 52 and the substrate P, it is possible to clean, with the second liquid LQ2, the upper surface (including the circumferential edge portion), the lower surface, and the side surface of the substrate P. The substrate P may be cleaned by supplying the second liquid LQ2 while rotating the substrate P.

The second liquid LQ2, which is adhered to the substrate P, can be removed by allowing the gas to blow against the substrate P, for example, from the blow members 37, 38 as shown in FIG. 7 with respect to the substrate P after the cleaning process. When the substrate P is cleaned, the supply of the second liquid LQ2 and the supply of the gas may be performed concurrently.

The substrate P can be also cleaned with the second liquid LQ2 supplied from the supply members 51, 52 of the cleaning unit 50 after the substrate P, for which the exposure process has been performed, is unloaded out of the substrate holder PH as described above. For example, when the substrate P is subjected to the liquid immersion exposure in the state in which the substrate P is held by the substrate holder PH, if the liquid makes inflow into the lower surface side of the substrate P via the gap A and the gap B (see FIG. 10), then it is feared that the foreign matter may be adhered to the side surface and the lower surface of the substrate P, and the adhesion trace of the first liquid LQ1 may be formed thereon. In this embodiment, the side surface and the lower surface of the substrate P can be cleaned satisfactorily as well. Therefore, even when the foreign matter is adhered to the side surface and the lower surface of the substrate P, it is possible to decrease or miniaturize or remove the foreign matter. Therefore, it is possible to avoid the pollution of the temperature adjustment mechanism in order to perform the post-baking (PEB) for the substrate P and the transport system for the substrate P after the cleaning process. It is also possible to avoid the occurrence of the pattern defect by performing the development process after the cleaning process.

Any liquid, which is different from the first liquid LQ1, can be also used as the second liquid LQ2 in the third embodiment. In particular, when only the portion including, for example, the side surface (circumferential edge portion 1As) and the back surface (lower surface) of the substrate P, which does not affect the photosensitive material 2, is cleaned in the third embodiment, an organic solvent such as a thinner can be used as the second liquid LQ2. Therefore, it is possible to effectively remove or provide small diameters of the adhered matter (foreign matter) on the side surface and the back surface of the substrate P.

Also in the third embodiment, it is possible to use the immersion process explained in the first embodiment in combination.

This embodiment is constructed such that the cleaning unit 50 is provided for the coater/developer apparatus C/D-SYS. It is of course allowable that the cleaning unit 50 is provided for the exposure apparatus EX-SYS. For example, the cleaning unit 50 may be provided at an intermediate position of the transport passage of the first transport system H1 for constructing the exposure apparatus EX-SYS. Accordingly, the substrate P after the liquid immersion exposure process can be cleaned with the second liquid LQ2 in the exposure apparatus EX-SYS. Alternatively, the cleaning unit 50 may be provided for the interface IF.

The second embodiment and the third embodiment are illustrative of the case in which the substrate P after the liquid immersion exposure is cleaned. However, an error is caused in some situations such that the substrate P, which makes contact with the first liquid LQ1, should be unloaded out of the substrate holder PH before the completion of the desired process including, for example, the exposure process on the substrate stage PST (substrate holder PH). Also in such a situation, it is possible to execute the cleaning process as explained in the second embodiment and the third embodiment.

A detection unit, which detects the foreign matter (including the liquid and/or the adhesion trace of the liquid) on the surface of the substrate P after the liquid immersion exposure, may be provided. Only when any unallowable foreign matter is detected on the surface of the substrate P, the substrate P may be cleaned by using the cleaning unit 50. In the second and third embodiments, the condition of the cleaning process can be set on the basis of the information about the substrate P as described above including, for example, the type of the photosensitive material 2.

Fourth Embodiment

Figure 17:
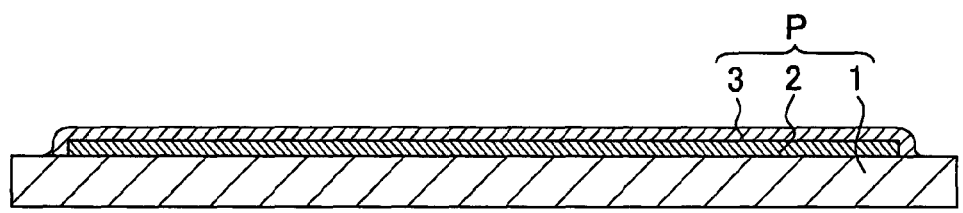
FIG. 17 shows a side sectional view illustrating an example of the substrate according to the third embodiment.

Next, a fourth embodiment will be explained with reference to FIGS. 17 and 18. The feature of the fourth embodiment resides in the fact that a thin film 3, which covers the photosensitive material 2, is formed on the surface of the substrate P to be exposed, as shown in FIG. 17. The thin film 3 includes, for example, an antireflection film (top ARC) and a top coat film (protective film). In a certain form, the thin film 3 is a top coat film which covers an antireflection film formed on the photosensitive material 2. The top coat film protects the photosensitive material 2 from the liquid, which is formed of, for example, a fluorine-based liquid-repellent material.

Figure 18:
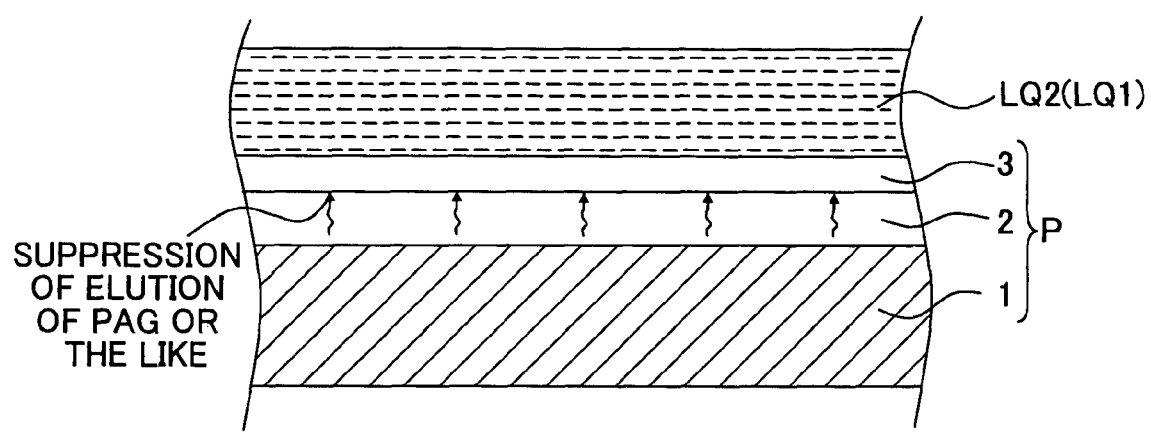
FIG. 18 schematically shows the behavior of the substrate for which the immersion process is performed.

As schematically shown in FIG. 18, when the thin film 3 is provided, it is possible to suppress the elution of the predetermined substance (for example, PAG) from the photosensitive material 2 to the liquid, even when the substrate P makes contact with the liquid. Therefore, when the photosensitive material 2 is coated with the thin film 3, the immersion condition, which is adopted when the immersion process is performed as explained in the first embodiment, can be changed with respect to the case in which the photosensitive material 2 is not coated with the thin film 3. That is, it is possible to set the immersion condition for the immersion process based on the use of the immersion unit 30 and the liquid immersion mechanism 100 depending on the information about the thin film 3 by using the presence or absence of the thin film 3 as the information about the substrate P. Specifically, it is possible to appropriately set, for example, the immersion time included in the immersion condition depending on the presence or absence of the thin film 3. For example, when the thin film 3 is present, the predetermined substance is not eluted substantially from the photosensitive material 2 to the liquid. Therefore, it is possible to shorten the immersion time, and/or it is possible to omit the immersion process itself.

When the thin film 3 is present, the elution of the predetermined substance from the photosensitive material 2 to the liquid is suppressed. Accordingly, it is possible to suppress the adhesion of the foreign matter to the substrate P and the formation of the adhesion trace. Therefore, the cleaning condition of the cleaning process as explained in the second and third embodiments may be appropriately set depending on the presence or absence of the thin film 3. For example, when the thin film 3 is present, then it is possible to shorten the cleaning time, and/or it is possible to omit the cleaning process itself.

There is also such a possibility that the predetermined substance contained in the photosensitive material 2 may be eluted into the liquid through the thin film 3, and the substance of the material for forming the thin film 3 may be eluted into the liquid, depending on the substance for constructing the thin film 3. Therefore, when the immersion process and the cleaning process are performed, it is desirable to consider, for example, the information about the material (substance) of the thin film 3 as well, without being limited to only the presence or absence of the thin film 3 on the photosensitive material 2, as the information about the substrate P.

When the thin film (top ARC, protective film) 3 is formed on the photosensitive material 2 in the first embodiment, it is also allowable that the immersion unit 30 is used as a unit for applying (forming) the thin film 3 as well.

The first and second liquids LQ1, LQ2 may be those which are composed of the same material (water) and which have properties or components (water qualities) different from each other. The items of the property or the component of the liquid herein include, for example, the specific resistance value of the liquid, the total organic carbon (TOC) in the liquid, the foreign matter including particles and bubbles contained in the liquid, the dissolved gas including the dissolved oxygen (DO) and the dissolved nitrogen (DN), the metal ion content, the silica concentration in the liquid, and the live bacteria or germs. For example, the sufficient cleanness is required for the first liquid LQ1 to be used for the liquid immersion exposure. However, it is allowable that the second liquid LQ2, which is used for the immersion process, has the cleanness lower than that of the first liquid LQ1. It is also possible to use various fluids, for example, the supercritical fluid as the first and second liquids LQ1, LQ2.

Liquids, which have the same material (water) and which have different temperatures, may be used as the first and second liquids LQ1, LQ2.

In the embodiment described above, it is preferable that the cleaning process time (Step S7.1) is set so that the period of time, which ranges from the completion of the liquid immersion exposure (Step S7) to the start of the post-baking (Step S8), is within a preset predetermined period of time. If any basic substance such as ammonia exists in the atmosphere in the first chamber apparatus CH1, it is feared that the basic substance may adhere to the surface of the photosensitive material 2, and the basic substance may cause the neutralization reaction with acid to cause the deactivation phenomenon of acid. Therefore, it is preferable that the post-baking is performed before the neutralization reaction is accelerated. Therefore, the post-baking can be executed before the neutralization reaction is accelerated, by setting the cleaning process time in consideration of the period of time ranging from the completion of the liquid immersion exposure to the start of the post-baking.

In the embodiment described above, the explanation has been made as exemplified by the case in which the chemical amplification type resist is used as the photosensitive material 2 by way of example. However, it is also allowable to use, for example, a novolac resin-based resist containing no PAG. Also in this case, the liquid immersion exposure process can be performed after removing the foreign matter on the photosensitive material beforehand by performing the immersion process. It is possible to avoid the formation of the adhesion trace by performing the cleaning process after the liquid immersion exposure process.

In the embodiment described above, the explanation has been made for the case in which the base material 1 is coated with the photosensitive material 2 in order to simplify the explanation. However, even when pattern layers are already formed on the base material 1 after performing several exposure steps, it is possible to perform the immersion process and the cleaning process as described above. In this case, it is also appropriate to consider the elution of the material for forming the pattern layers into the liquid.

As described above, the liquid (first liquid) is pure water in the embodiment of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to clean the surface of the substrate P and the surface of the optical element provided at the end surface of the projection optical system PL. When the purity of pure water supplied from the factory or the like is low, it is also allowable that the exposure apparatus is provided with an ultra pure water-producing unit.

It is approved that the refractive index n of pure water (water) with respect to the exposure light beam EL having a wavelength of about 193 nm is approximately 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method is used as described above, the numerical aperture NA of the projection optical system is 0.9 to 1.3 in some cases. When the numerical aperture NA of the projection optical system is large as described above, it is desirable to use the polarized illumination, because the image formation performance is deteriorated due to the polarization effect in some cases with the random polarized light which has been hitherto used as the exposure light beam. In this case, it is appropriate that the linear polarized illumination, which is adjusted to the longitudinal direction of the line pattern of the line-and-space pattern of the mask (reticle), is effected so that the diffracted light of the S-polarized light component (TE-polarized light component), i.e., the component in the polarization direction along with the longitudinal direction of the line pattern is dominantly allowed to outgo from the pattern of the mask (reticle). When the space between the projection optical system PL and the resist coated on the surface of the substrate P is filled with the liquid, the diffracted light of the S-polarized light component (TE-polarized light component), which contributes to the improvement in the contrast, has the high transmittance on the resist surface, as compared with the case in which the space between the projection optical system PL and the resist coated on the surface of the substrate P is filled with the air (gas). Therefore, it is possible to obtain the high image formation performance even when the numerical aperture NA of the projection optical system exceeds 1.0. Further, it is more effective to appropriately combine, for example, the phase shift mask and the oblique incidence illumination method (especially the dipole illumination method) adjusted to the longitudinal direction of the line pattern as disclosed in Japanese Patent Application Laid-open No. 6-188169. In particular, the combination of the linear polarized illumination method and the dipole illumination method is effective when the periodic direction of the line-and-space pattern is restricted to one predetermined direction and when the hole pattern is clustered in one predetermined direction. For example, when a phase shift mask of the half tone type having a transmittance of 6% (pattern having a half pitch of about 45 nm) is illuminated by using the linear polarized illumination method and the dipole illumination method in combination, the depth of focus (DOF) can be increased by about 150 nm as compared with the use of the random polarized light provided that the illumination σ, which is prescribed by the circumscribed circle of the two light fluxes for forming the dipole on the pupil plane of the illumination system, is 0.95, the radius of each of the light fluxes at the pupil plane is 0.125σ, and the numerical aperture of the projection optical system PL is NA=1.2.

It is also effective to adopt a combination of the linear polarized illumination and the small σ illumination method (illumination method wherein the σ value, which indicates the ratio between the numerical aperture NAi of the illumination system and the numerical aperture NAp of the projection optical system, is not more than 0.4).

For example, when the ArF excimer laser is used as the exposure light beam, and the substrate P is exposed with a fine line-and-space pattern (for example, line-and-space of about 25 to 50 nm) by using the projection optical system PL having a reduction magnification of about ¼, then the mask M acts as a polarizing plate due to the Wave guide effect depending on the structure of the mask M (for example, the pattern fineness and the thickness of chromium), and the diffracted light of the S-polarized light component (TE-polarized light component) outgoes from the mask M in an amount larger than that of the diffracted light of the P-polarized light component (TM-polarized light component) which lowers the contrast. In this case, it is desirable to use the linear polarized illumination as described above. However, even when the mask M is illuminated with the random polarized light, it is possible to obtain the high resolution performance even when the numerical aperture NA of the projection optical system PL is large, i.e., 0.9 to 1.3.

When the substrate P is exposed with an extremely fine line-and-space pattern on the mask M, there is such a possibility that the P-polarized light component (TM-polarized light component) is larger than the S-polarized light component (TE-polarized light component) due to the Wire Grid effect. However, for example, when the ArF excimer laser is used as the exposure light beam, and the substrate P is exposed with a line-and-space pattern larger than 25 nm by using the projection optical system PL having a reduction magnification of about ¼, then the diffracted light of the S-polarized light component (TE-polarized light component) outgoes from the mask M in an amount larger than that of the diffracted light of the P-polarized light component (TM-polarized light component). Therefore, it is possible to obtain the high resolution performance even when the numerical aperture NA of the projection optical system PL is large, i.e., 0.9 to 1.3.

Further, it is also effective to use the combination of the oblique incidence illumination method and the polarized illumination method in which the linear polarization is effected in the tangential (circumferential) direction of the circle having the center of the optical axis as disclosed in Japanese Patent Application Laid-open No. 6-53120, without being limited to only the linear polarized illumination (S-polarized illumination) adjusted to the longitudinal direction of the line pattern of the mask (reticle). In particular, when the pattern of the mask (reticle) includes not only the line pattern extending in one predetermined direction, but the pattern also includes the line patterns extending in a plurality of different directions in a mixed manner (line-and-space patterns having different periodic directions are present in a mixed manner), then it is possible to obtain the high image formation performance even when the numerical aperture NA of the projection optical system is large, by using, in combination, the zonal illumination method and the polarized illumination method in which the light is linearly polarized in the tangential direction of the circle having the center of the optical axis, as disclosed in Japanese Patent Application Laid-open No. 6-53120 as well. For example, when a phase shift mask of the half tone type having a transmittance of 6% (pattern having a half pitch of about 63 nm) is illuminated by using, in combination, the zonal illumination method (zonal ratio: ¾) and the polarized illumination method in which the light is linearly polarized in the tangential direction of the circle having the center of the optical axis, the depth of focus (DOF) can be increased by about 250 nm as compared with the use of the random polarized light provided that the illumination σ is 0.95 and the numerical aperture of the projection optical system PL is NA=1.00. In the case of a pattern having a half pitch of about 55 nm and a numerical aperture of the projection optical system NA=1.2, the depth of focus can be increased by about 100 nm.

In addition to the various types of the illumination methods as described above, it is also effective to adapt, for example, the progressive multi-focal exposure method disclosed in Japanese Patent Application Laid-open Nos. 4-277612 and 2001-345245, and the multiwavelength exposure method to obtain an effect equivalent to that of the progressive multi-focal exposure method by using a multiwavelength (for example, biwavelength) exposure light beam.

In the embodiment of the present invention, the optical element LS1 is attached to the end portion of the projection optical system PL. Such an optical element makes it possible to adjust the optical characteristics of the projection optical system PL, for example, the aberration (for example, spherical aberration and coma aberration). The optical element, which is attached to the end portion of the projection optical system PL, may be an optical plate which is usable to adjust the optical characteristics of the projection optical system PL. Alternatively, the optical element may be a plane-parallel plate through which the exposure light beam EL is transmissive.

When the pressure, which is generated by the flow of the liquid LQ, is large between the substrate P and the optical element disposed at the end portion of the projection optical system PL, it is also allowable that the optical element is tightly fixed so that the optical element is not moved by the pressure, without allowing the optical element to be exchangeable.

In the embodiment of the present invention, the space between the projection optical system PL and the surface of the substrate P is filled with the liquid. However, for example, it is also allowable that the space is filled with the liquid LQ in such a state that a cover glass composed of a parallel flat plate is attached to the surface of the substrate P.

In the projection optical system of the embodiment described above, the optical path space, which is arranged on the image plane side of the optical element disposed at the end portion, is filled with the liquid. However, as disclosed in International Publication No. 2004/019128, it is also possible to adopt a projection optical system in which the optical path space arranged on the mask side of the optical element disposed at the end portion is also filled with the liquid.

The liquid (first liquid) is water in the embodiment of the present invention. However, the liquid may be any liquid other than water. For example, when the light source of the exposure light beam EL is the $F_2$ laser, the $F_2$ laser beam is not transmitted through water. Therefore, those preferably usable as the liquid LQ may include, for example, fluorine-based fluids such as fluorine-based oil and perfluoropolyether (PFPE) through which the $F_2$ laser beam is transmissive. In this case, the portion, which makes contact with the liquid, is subjected to a liquid-attracting treatment by forming, for example, a thin film with a substance having a molecular structure containing fluorine having small polarity. Alternatively, other than the above, it is also possible to use, as the liquid LQ, those (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid LQ to be used.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic silica glass, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P.

As for the exposure apparatus EX, the present invention is also applicable to the exposure apparatus based on the system in which the full field exposure is performed on the substrate P by using a projection optical system (for example, the dioptric type projection optical system having a reduction magnification of ⅛ and including no catoptric element) with a reduction image of a first pattern in a state in which the first pattern and the substrate P are allowed to substantially stand still. In this case, the present invention is also applicable to the full field exposure apparatus based on the stitch system in which the full field exposure is further performed thereafter on the substrate P by partially overlaying a reduction image of a second pattern with respect to the first pattern by using the projection optical system in a state in which the second pattern and the substrate P are allowed to substantially stand still. As for the exposure apparatus based on the stitch system, the present invention is also applicable to the exposure apparatus based on the step-and-stitch system in which at least two patterns are partially overlaid and transferred on the substrate P, and the substrate P is successively moved. The embodiment described above has been explained as exemplified by the exposure apparatus provided with the projection optical system PL by way of example. However, the present invention is applicable to the exposure apparatus and the exposure method in which the projection optical system PL is not used.

The present invention is also applicable to the twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Japanese Patent Application Laid-open No. 2000-505958 (PCT) (corresponding to U.S. Pat. No. 5,969,441), and U.S. Pat. No. 6,208,407. The disclosures thereof are incorporated herein by reference within a range of permission of the domestic laws and ordinances of the state designated or selected in this international application.

The present invention is also applicable to an exposure apparatus provided with a substrate stage which retains the substrate and a measuring stage which carries various photoelectric sensors and reference members formed with reference marks as disclosed in Japanese Laid-Open Patent Publication No. 11-135400.

In the embodiment described above, the exposure apparatus, in which the space between the projection optical system PL and the substrate P is locally filled with the liquid, is adopted. However, the present invention is also applicable to a such liquid immersion exposure apparatus that the exposure is performed in a state in which the entire surface of the substrate as the exposure objective is immersed in a liquid as disclosed, for example, in Japanese Patent Application Laid-open Nos. 6-124873 and 10-303114 and U.S. Pat. No. 5,825,043. The structure and the exposure operation of such a liquid immersion exposure apparatus are described in detail, for example, in U.S. Pat. No. 5,825,043. The contents of the description in this United States patent document are incorporated herein by reference within a range of permission of the domestic laws and ordinances of the state designated or selected in this international application.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118. The contents of the descriptions in the literatures are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by means of the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL, as described in Japanese Patent Application Laid-open No. 8-166475 (U.S. Pat. No. 5,528,118). The contents of the descriptions in U.S. Pat. No. 5,528,118 are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL, as described in Japanese Patent Application Laid-open No. 8-330224 (U.S. Pat. No. 5,874,820). The disclosure of U.S. Pat. No. 5,874,820 is incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 19:
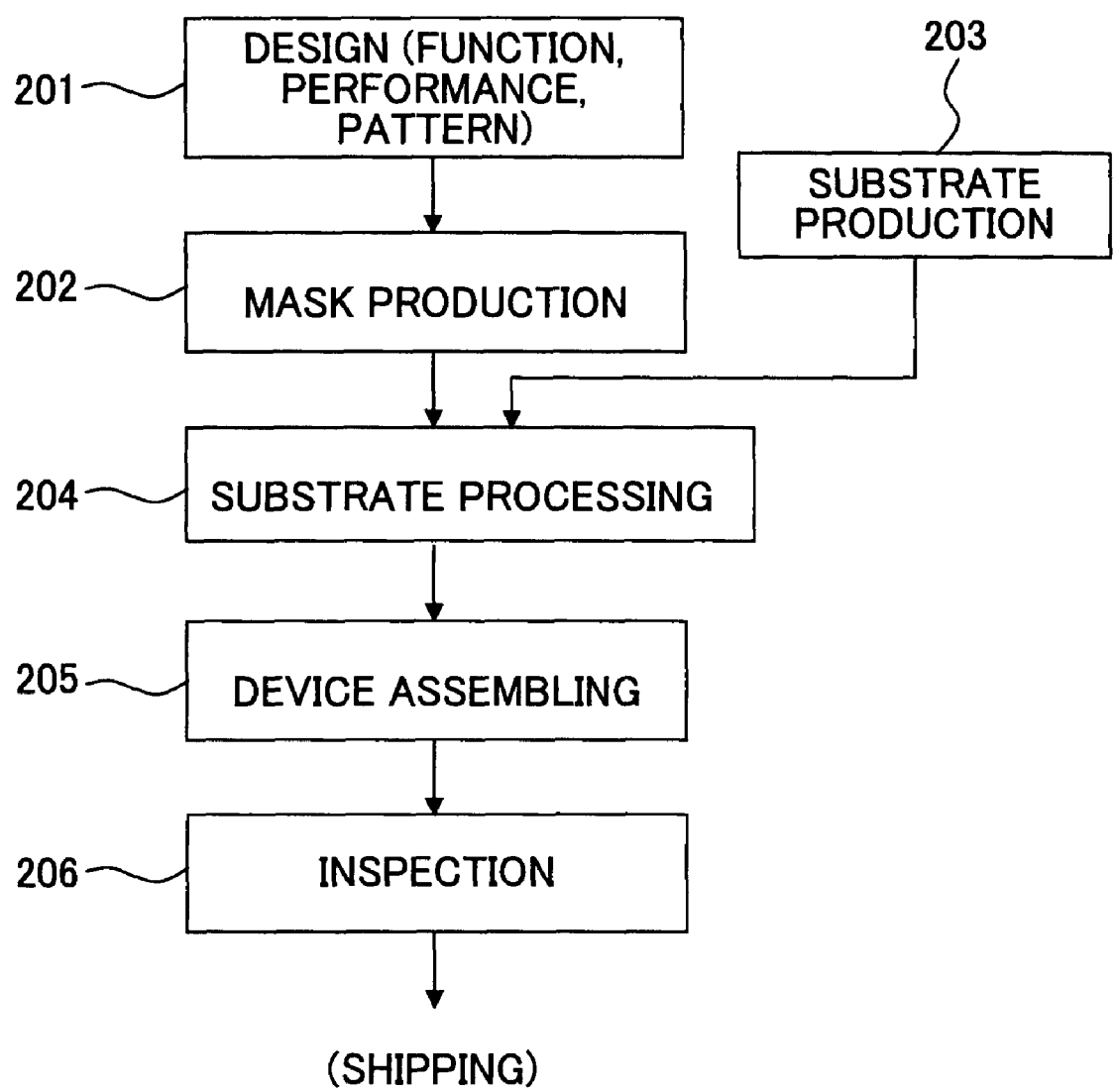
FIG. 19 shows a flow chart illustrating exemplary steps for producing a microdevice.

As shown in FIG. 19, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate processing step (exposure process step) 204 of exposing a pattern of the mask on the substrate by using the exposure apparatus EX of the embodiment described above and developing the exposed substrate, a step of assembling the device (including machining processes including, for example, a dicing step, a bonding step, and a packaging step) 205, and an inspection step 206. The substrate processing step 204 includes the immersion step and the cleaning step as explained with reference to FIGS. 3 and 13 distinctly from the exposure step.

INDUSTRIAL APPLICABILITY

According to the present invention, the substrate can be satisfactorily processed in relation to the liquid immersion exposure. Therefore, it is possible to produce the device having the desired performance.

The invention claimed is:

1. A substrate processing method comprising:
holding a substrate on a substrate holder;
exposing the substrate held on the substrate holder by forming a liquid immersion area of a first liquid on the substrate and radiating an exposure light beam onto the substrate through the first liquid;
immersing the substrate in a second liquid, before the substrate is loaded on the substrate holder and before exposing the substrate; and
adjusting a temperature of the substrate to be a predetermined temperature after a process of removing the second liquid from the substrate and before the substrate is loaded on the substrate holder, wherein
the predetermined temperature is based on at least one of the temperature of the substrate holder and a temperature of the first liquid.

2. The substrate processing method according to claim 1, wherein:
the substrate includes a base material and a photosensitive material with which a surface of the base material is coated; and
a liquid immersion condition for immersing the substrate in the second liquid is set depending on information about the substrate.

3. The substrate processing method according to claim 2, wherein the information about the substrate includes information about the photosensitive material.

4. The substrate processing method according to claim 3, wherein the information about the substrate includes elution time for which a part of a substance contained in the photosensitive material is eluted into the second liquid.

5. The substrate processing method according to claim 2, wherein the information about the substrate includes information about a protective film which covers the photosensitive material therewith.

6. The substrate processing method according to claim 5, wherein the information about the substrate includes the presence or absence of the protective film.

7. The substrate processing method according to claim 2, wherein the liquid immersion condition includes a removal condition of the second liquid.

8. The substrate processing method according to claim 2, wherein the liquid immersion condition for immersing the substrate in the second liquid includes immersion time.

9. The substrate processing method according to claim 2, further comprising forming a thin film on the photosensitive material with which the base material is coated.

10. The substrate processing method according to claim 1, wherein the liquid immersion area of the first liquid is formed on the substrate after removing the second liquid from the substrate.

11. The substrate processing method according to claim 1, wherein the temperature of the substrate is adjusted to compensate a temperature change of the substrate caused by heat of vaporization generated when the second liquid is removed.

12. The substrate processing method according to claim 1, wherein the first liquid is the same as the second liquid.

13. The substrate processing method according to claim 1, wherein the first liquid is different from the second liquid.

14. The substrate processing method according to claim 1, further comprising preparing the substrate by coating a base material with a photosensitive material, and pre-baking the prepared substrate, wherein the substrate is immersed in the second liquid after pre-baking the substrate.

15. A method for producing a device, comprising:
the substrate processing method as defined in claim 14;

developing the substrate after exposing the substrate; and processing the developed substrate.

16. The substrate processing method according to claim 1, wherein the temperature of the substrate is adjusted such that the adjusted temperature is approximately the same as the temperature of the substrate holder.

17. The substrate processing method according to claim 1, wherein the temperature of the substrate is adjusted such that the adjusted temperature is approximately the same as the temperature of the first liquid.

18. The substrate processing method according to claim 1, wherein the first liquid and the second liquid are pure water, and the first liquid is different from the second liquid in a property or a component.

19. An exposure apparatus which exposes a substrate by forming a liquid immersion area of a first liquid on the substrate and radiating an exposure light beam onto the substrate through the first liquid, the exposure apparatus comprising:
   a substrate holder on which the substrate is held, the substrate being loaded on the substrate holder after immersing the substrate in a second liquid and after a process of removing the second liquid from the substrate;
   a projection system by which the exposure light beam is radiated onto the substrate held by the substrate holder through the first liquid in the liquid immersion area formed on the substrate; and
   a temperature adjustment device which adjusts a temperature of the substrate to be a predetermined temperature after the process of removing the second liquid from the substrate and before loading the substrate on the substrate holder, wherein the predetermined temperature is based on at least one of a temperature of the substrate holder and a temperature of the first liquid.

20. The exposure apparatus according to claim 19, further comprising:
   a transport system which transports the substrate; and
   an immersion device which is provided at an intermediate position of a transport passage of the transport system and which immerses the substrate in the second liquid before the temperature of the substrate is adjusted by the temperature adjustment device.

21. The exposure apparatus according to claim 20, wherein the immersion device sets an immersion condition for immersing the substrate in the second liquid on the basis of information about the substrate.

22. The exposure apparatus according to claim 19, wherein the temperature adjustment device adjusts the temperature of the substrate to compensate a temperature change of the substrate caused by heat of vaporization generated when the second liquid is removed.

23. A method for producing a device comprising:
   exposing a substrate with the exposure apparatus as defined in claim 19; and
   developing the substrate to form the device.

24. The exposure apparatus according to claim 19, wherein the first liquid is the same as the second liquid.

25. The exposure apparatus according to claim 19, wherein the first liquid and the second liquid are pure water, and the first liquid is different from the second liquid in a property or a component.

26. The exposure apparatus according to claim 19, wherein the first liquid is different from the second liquid.

27. The exposure apparatus according to claim 19, wherein the temperature of the substrate is adjusted such that the adjusted temperature is approximately the same as the temperature of the substrate holder.

28. The exposure apparatus according to claim 19, wherein the temperature of the substrate is adjusted such that the adjusted temperature is approximately the same as the temperature of the first liquid.

* * * * *